United States Patent [19]

Iguchi

[11] Patent Number: 5,597,749

[45] Date of Patent: Jan. 28, 1997

[54] METHOD OF MAKING NONVOLATILE MEMORY CELL WITH CRYSTALLIZED FLOATING GATE

[75] Inventor: Katsuji Iguchi, Yamatokoriyama, Japan

[73] Assignee: Sharp Kabushiki Kaisha, Osaka, Japan

[21] Appl. No.: 447,243

[22] Filed: May 22, 1995

Related U.S. Application Data

[62] Division of Ser. No. 262,831, Jun. 21, 1994, Pat. No. 5,493,140.

[30] Foreign Application Priority Data

Jul. 5, 1993 [JP] Japan .................................. 5-165789

[51] Int. Cl.$^6$ .............................................. H01L 21/8247
[52] U.S. Cl. ........................... 437/43; 437/101; 437/233; 437/247
[58] Field of Search ............................. 437/43, 247, 101, 437/48, 52, 233

[56] References Cited

U.S. PATENT DOCUMENTS

| | | | |
|---|---|---|---|
| 5,029,130 | 7/1991 | Yeh | 365/185 |
| 5,045,488 | 9/1991 | Yeh | 437/43 |
| 5,067,108 | 11/1991 | Jenq | 365/185 |
| 5,208,175 | 5/1993 | Choi et al. | 437/43 |
| 5,284,784 | 2/1994 | Manley | 437/43 |
| 5,352,291 | 10/1994 | Zhang et al. | 117/8 |
| 5,453,388 | 9/1995 | Chen et al. | 437/30 |

FOREIGN PATENT DOCUMENTS

| | | |
|---|---|---|
| 64-13771 | 1/1989 | Japan . |
| 1-129465 | 5/1989 | Japan . |
| 2-31467 | 2/1990 | Japan . |
| 2199987A | 7/1988 | United Kingdom . |

OTHER PUBLICATIONS

Salsbury et al, "High Performance MOS EPROMs Using a Stacked-Gate Cell", 1977 IEEE International Solid-State Circuits Conference, 1977.

Perlegos et al, "A 64K EPROM Using Scaled MOS Technology", 1980 IEEE International Solid-State Circuits Conference, 1980.

Buskirk et al, "A 200ns 256K HMOSII EPROM", 1983 IEEE International Solid-State Circuits Conferecne, 1983.

Gupta et al, "A 5V-Only 16K EEPROM Utilizing Oxynitride Dielectrics and EPROM Redundancy", 1982 IEEE International Solid-State Circuits Conference, 1982.

Kynett et al, "An In-System Reprogrammable 256K CMOS Flash Memory", 1988 IEEE International Solid-State Circuits Conference, 1988.

Tam et al, "A High Density CMOS I-T Electrically Erasable Non-Volatile (Flash) Memory Technology", 1988 Symposium on VLSI Technology, 1988.

Woo et al, "A Poly-Buffered FACE Technology for High Density Flash Memories", 1991 Symposium on VLSI Technology, 1991.

Sato et al, "An Ultra-Thin Fully Depleted Floating Gate Technology for 64Mb Flash and Beyond", 1994 Symposium on VLSI Technology, 1994.

*Primary Examiner*—John Niebling
*Assistant Examiner*—Richard A. Booth
*Attorney, Agent, or Firm*—Nixon & Vanderhye P.C.

[57] ABSTRACT

The nonvolatile memory cell of this invention includes a floating gate formed of an ultra-thin polycrystalline silicon film. Since the memory cell includes such an ultra-thin floating gate with a smooth surface, problems occurring in the patterning for the floating gate in conventional memory cells can be solved. In addition, the memory cells of the invention are suitable for device integration. Especially when the floating gate is formed of a polycrystalline silicon film, the device characteristics such as writing speed are remarkably improved.

9 Claims, 27 Drawing Sheets

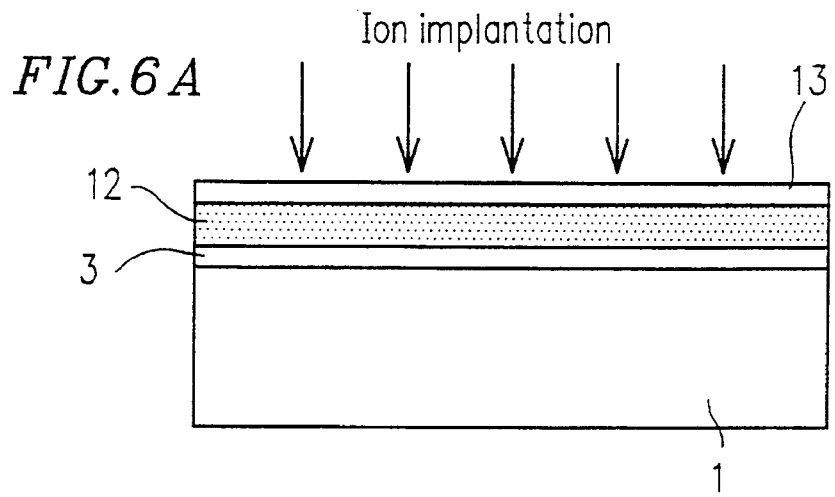
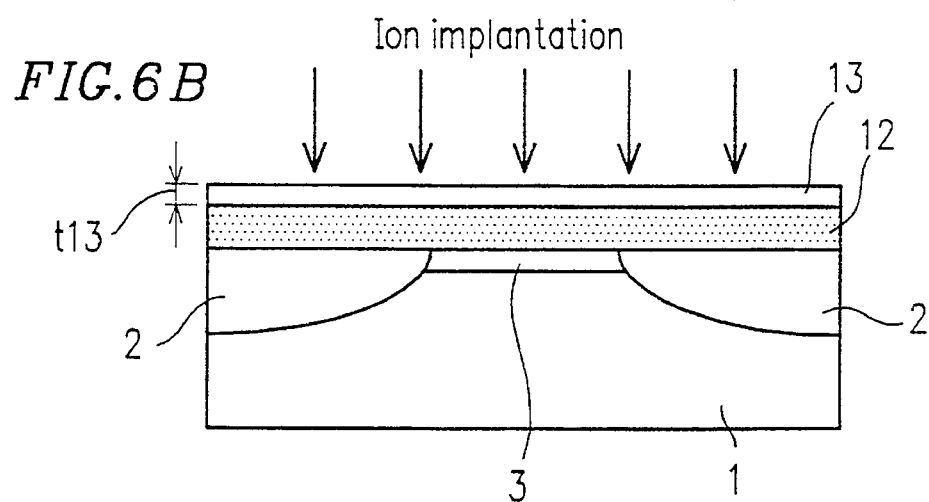
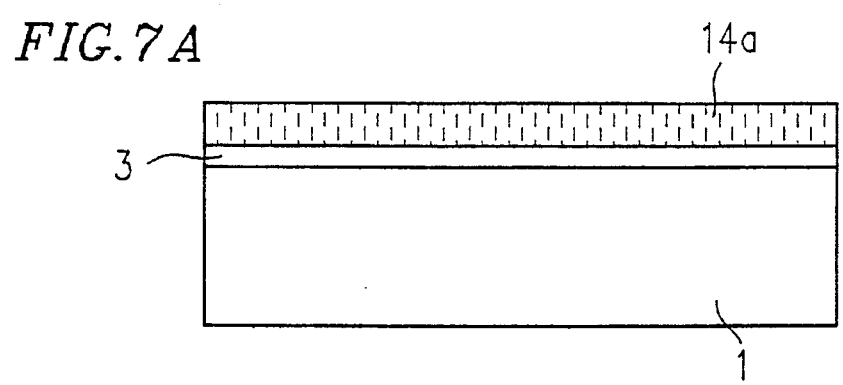
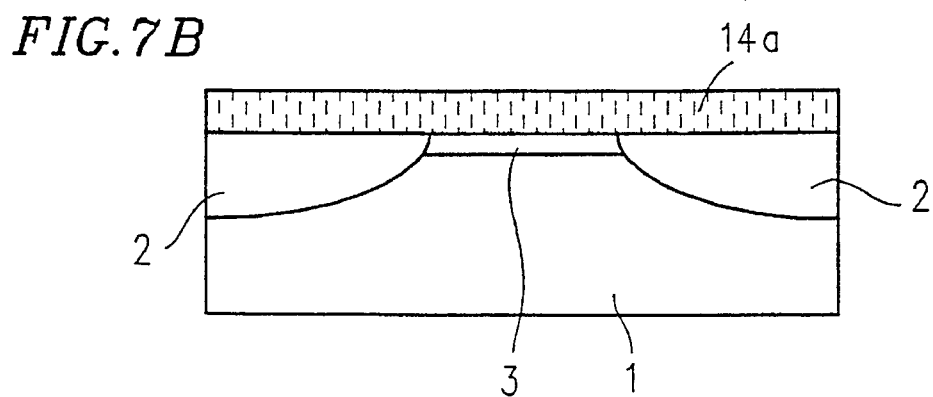

FIG.18

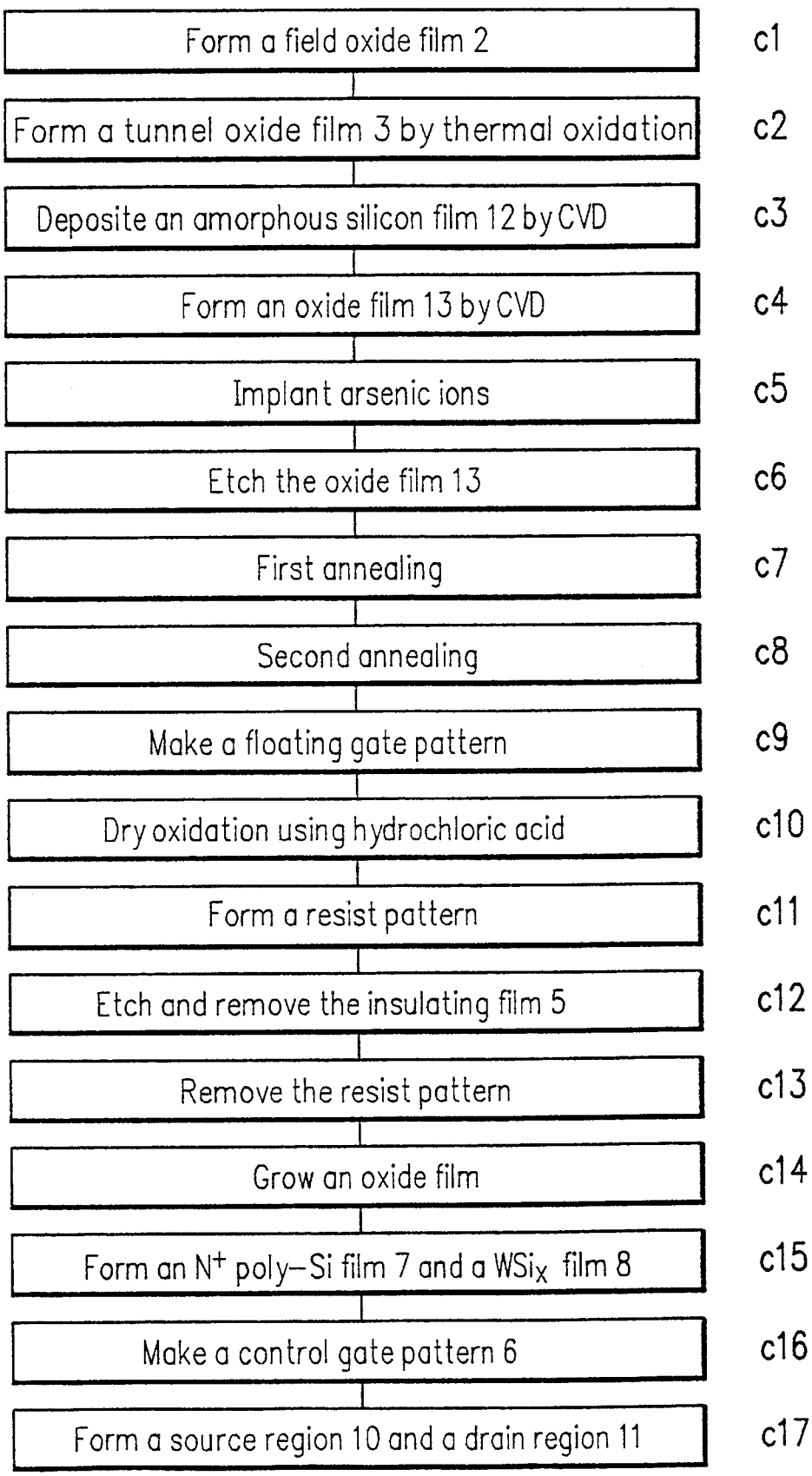

| Step | Description |
|---|---|
| c1 | Form a field oxide film 2 |
| c2 | Form a tunnel oxide film 3 by thermal oxidation |
| c3 | Deposit an amorphous silicon film 12 by CVD |
| c4 | Form an oxide film 13 by CVD |
| c5 | Implant arsenic ions |
| c6 | Etch the oxide film 13 |
| c7 | First annealing |
| c8 | Second annealing |
| c9 | Make a floating gate pattern |
| c10 | Dry oxidation using hydrochloric acid |
| c11 | Form a resist pattern |
| c12 | Etch and remove the insulating film 5 |
| c13 | Remove the resist pattern |
| c14 | Grow an oxide film |
| c15 | Form an $N^+$ poly-Si film 7 and a $WSi_x$ film 8 |
| c16 | Make a control gate pattern 6 |
| c17 | Form a source region 10 and a drain region 11 |

FIG.19

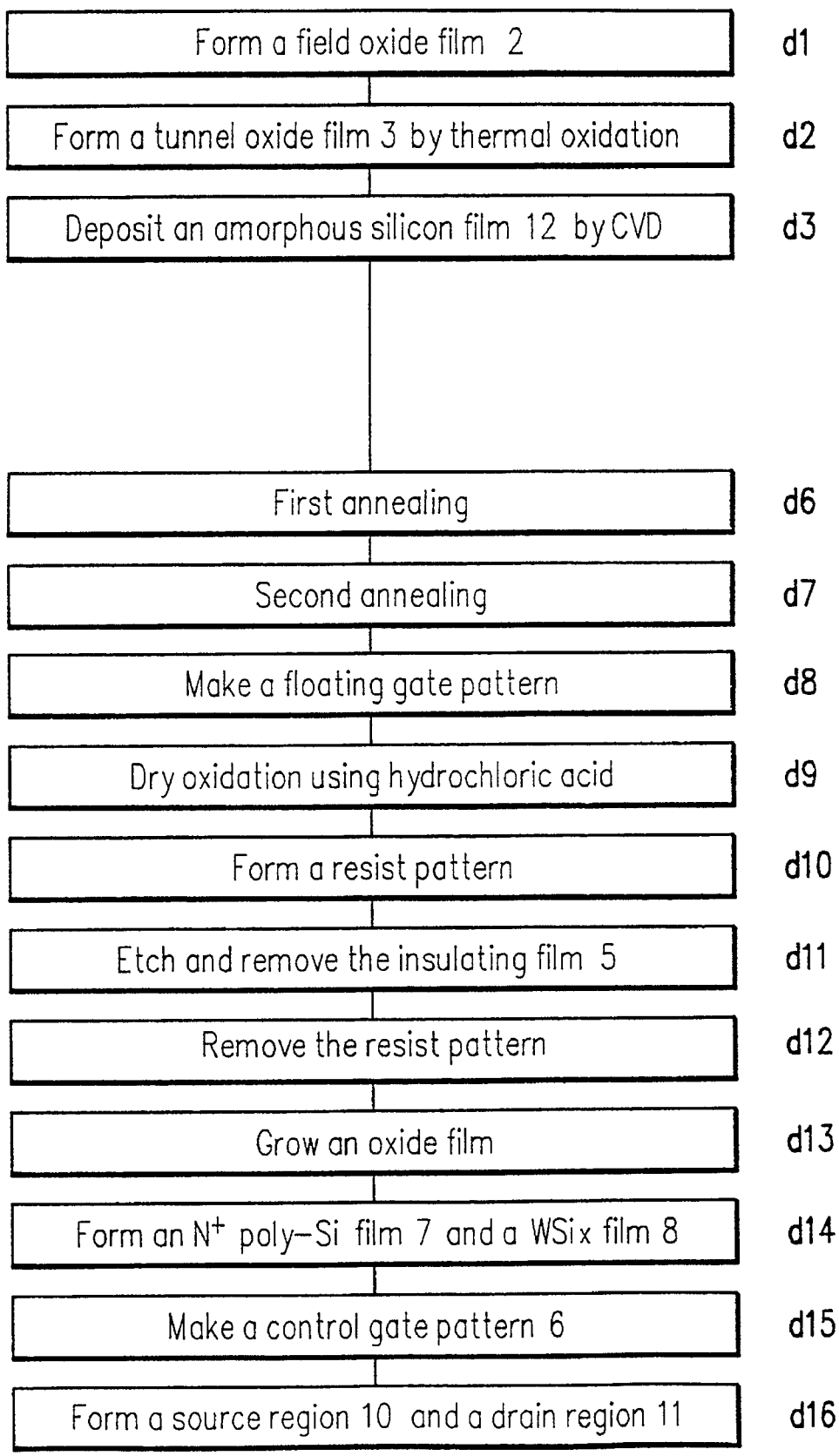

| Step | Description |
|---|---|
| d1 | Form a field oxide film 2 |
| d2 | Form a tunnel oxide film 3 by thermal oxidation |
| d3 | Deposit an amorphous silicon film 12 by CVD |
| d6 | First annealing |
| d7 | Second annealing |
| d8 | Make a floating gate pattern |
| d9 | Dry oxidation using hydrochloric acid |
| d10 | Form a resist pattern |
| d11 | Etch and remove the insulating film 5 |
| d12 | Remove the resist pattern |
| d13 | Grow an oxide film |
| d14 | Form an $N^+$ poly-Si film 7 and a $WSi_x$ film 8 |
| d15 | Make a control gate pattern 6 |
| d16 | Form a source region 10 and a drain region 11 |

PRIOR ART

METHOD OF MAKING NONVOLATILE MEMORY CELL WITH CRYSTALLIZED FLOATING GATE

This is a divisional of application Ser. No. 08/262,831, filed Jun. 21, 1994, now U.S. Pat. No. 5,493,140.

BACKGROUND OF THE INVENTION

1. Field of the Invention

The present invention relates to a nonvolatile memory cell and a method of producing the same. More particularly, the present invention relates to a electrically rewritable nonvolatile memory cell which is suitable for a flash memory, and a method of producing the same.

2. Description of the Related Art

A flash memory utilizing hot electron injection for programming, and Fowler-Nordheim tunneling for erasing has been actively developed. A flash memory is a memory which is byte-electrically programmable and block-electrically erasable. FIGS. 30, 31, and 32 show a memory cell of a typical flash memory which is currently produced. The memory cell is used in NOR type flash memory or a NAND type flash memory. The construction of the memory cell is the same as that of a memory cell of an electrically programmable read only memory (EPROM). Hereinafter, a memory cell of an NOR type flash memory is described.

Referring to FIGS. 30 to 32, a nonvolatile memory cell of a conventional flash memory is described. FIG. 30 is a plan view of a conventional memory cell 50, FIG. 31 is a cross-sectional view taken along the line X31—X31 in FIG. 30, and FIG. 32 is a cross-sectional view taken along the line X32—X32. A flash memory includes a number of memory cells 50, but these figures each show only one memory cell 50 for simplicity. A control gate 56 shown in the figures functions as a control gate for a plurality of memory cells. On the other hand, a floating gate 54 is individually provided for each memory cell 50, in an electrically floating state.

The surface of a silicon substrate 51 is divided into a plurality of active regions, and element isolating regions for isolating the active regions from each other. In the element isolating region of the silicon substrate 51, as is shown in FIG. 32, a field oxide film (a LOCOS film) 52 is formed. In the active region 51a of the silicon substrate 51, as is shown in FIG. 31, a source region 60 and a drain region 61 are provided. On the active region 51a of the silicon substrate 51, a tunnel oxide film (a first insulating film ) 53 made of $SiO_2$, a floating gate 54, an oxide-nitride-oxide (ONO) insulating film (a second insulating film) 55, and a control gate 56 are successively formed in this order. The control gate 56 has a polycide structure including an $N^+$ polycrystalline silicon film 57 as a lower layer and a $WSi_x$ film 58 as an upper layer. Hereinafter, the term "polycrystalline silicon" is referred to as "poly-Si".

In the flash memory of NOR type, a bit line (not shown) which is a common line for a plurality of memory cells 50 is connected to the drain region 61 of the memory cell 50. The source region 60 itself extends as an interconnection of a diffused layer in parallel to a direction along which the control gate 56 extends. The diffused layer interconnection serves as a common interconnection (a common source region) between a plurality of memory cells 50.

In such prior art, a poly-Si film which is to be a floating gate 54 is first processed so as to have a shape extending in a traverse direction from FIG. 30, thereby obtaining a poly-Si film 64b. The poly-Si film 64b completely covers the active region of the silicon substrate 51, and covers part of the field oxide film 52. Thereafter, when a polycide film is patterned to form a control gate 56, the poly-Si film 64b is processed again so as to form a floating gate 54. As a result, the floating gate 54 is formed only in an overlapping portion of the poly-Si film 64b and the control gate 56, as is shown in FIG. 30. In this way, the position and the shape of the floating gate 54 is self-aligned with the control gate 56 as is shown in FIG. 31.

The tunnel oxide film 53 is a thermal oxide film having a thickness t1 of 8–15 nanometers (nm). The floating gate 54 is usually formed of poly-Si in which phosphorus of about $1\times10^{20}/cm^3$ is diffused. In general, the thickness t2 of the poly-Si is in the range of about 100 to 300 nm. The ONO insulating film 55 is formed in the following manner. First, an oxide film (having a thickness in the range of about 5 to 10 nm) is obtained by thermally oxidizing the floating gate 54. On the thermal oxide film, an SiN film (having a thickness in the range of about 8–15 nm) is deposited by chemical vapor deposition (CVD). Then, an oxide film (having a thickness in the range of 5 to 10 nm) is formed by thermal oxidation or CVD. The ONO insulating film is an extremely thin film. Specifically, the total film thickness t3 of the ONO insulating film 55 is about 20 nm at the most in the equivalent oxide thickness. Instead of the ONO insulating film 55, a thermal oxide film may be used.

In the above prior art, immediately after the etching of the control gate 56, the floating gate 54 is etched. In more detail, the $WSi_x$ film 58 and the $N^+$ poly-Si film 57 which constitute the control gate 56 are etched, so as to obtain the control gate 56 as is shown in FIG. 30. Then, the ONO insulating film 55 is etched. Thereafter, the poly-Si film 64b should be etched so as to form the floating gate 54.

As is shown in FIG. 32, a stepped portion 55a of the ONO insulating film 55 is formed on the side face of the floating gate 54. The stepped portion 55a should be completely removed in the etching step of the ONO insulating film 55. In order to entirely remove the stepped portion 55a, it is necessary to perform the etching step of the ONO insulating film 55 for a time period which is sufficient to completely etch an insulating film having a thickness at least equal to the height of the stepped portion 55a (which is equal to the thickness of the floating gate 54).

An insufficient etching of the stepped portion 55a causes the following problems. The problems are described with reference to FIGS. 33 and 34. FIG. 33 is a cross-sectional view taken along the line X33—X33 in FIG. 30. If the stepped portion 55a is insufficiently etched, the non-etched portion of the ONO insulating film 55 forms a fence 70 as is shown in FIG. 33. The fence 70 may serve as a mask, so that another fence 71 is produced as a non-etched portion of poly-Si which constitutes the floating gate.

The fence 71 of poly-Si electrically short-circuits the floating gates of a plurality of memory cells 50 adjacent to each other, and allows the electric charges in the floating gates 54 to escape. Accordingly, the production of a fence 71 must be avoided in the flash memory cell 50.

In order to remove the ONO insulating film 55 having the thickness t3 of about 20 nm, the etching step is performed for an amount corresponding to the thickness t2 of the floating gate 54. As a result, the field oxide film 52 which is not covered with the floating gate 54 and the control gate 56 is etched, so as to form a recess 52a in the field oxide film 52 as is shown in FIG. 34. Since thickness of an end portion of the field oxide film 52 is gradually reduced, a portion of the silicon substrate 51 in the element isolating region may be disadvantageously exposed due to the formation of the recess 52a in the end portion of the field oxide film 52. After the etching step of the ONO insulating film 55, an etching step of the poly-Si film is performed in order to form the floating gate 54. If the portion of the silicon substrate 51 is exposed, the exposed portion may be etched in the etching step of the poly-Si film.

In order to solve the above problem, it is necessary to form the floating gate 54 (the poly-Si film 64b) so as to overlap the field oxide film 52 with a sufficiently large width, for the purpose of preventing the thin end portion of the field oxide film 52 on the active region side from being exposed. The increase of the overlap amount corresponds to the increase of the total width of the poly-Si film 64b in FIG. 30 (i.e., the length measured along a direction in which the control gate 56 extends).

In the case of FIG. 34, one end portion of the field oxide film 52 in the traverse direction of FIG. 32 has a smooth slope at the interface with the silicon substrate 51, the angle θ indicating the thickness distribution of an oxide film constituting the field oxide film 52 is 45°, and the film thickness t2 of the floating gate 54 is 150 nm. In such a case, a necessary overlap amount L1 of the floating gate 54 (the poly-Si film 64b) on the field oxide film 52 is at least 150 nm. As a result, as compared with the case where such an overlap amount L1 is not required, the width of the memory cell 50 corresponding to the length of the memory cell 50 in the traverse direction of FIG. 32 is increased by at least 300 nm.

In most cases, the floating gate 54 exists only within the array of memory cells 50. Accordingly, the memory cell array is higher than a peripheral circuit portion by an amount of at least the floating gate 54 and the control gate 56. Therefore, a metal interconnection for connecting the memory cell array and the peripheral circuit portion is extended over the height difference between the memory cell array and the peripheral circuit portion. For this reason, an extra focus margin corresponding to the height difference is required in a photo process such as an exposure of a photomask. In order to minimize the focus margin, it is necessary to minimize the thicknesses of the floating gate 54 and the control gate 56.

In the case where the floating gate 54 and the control gate 56 are not thin, and the silicon substrate 51 is exposed to light using a photomask for forming the metal interconnection, for example, the light is focused on the memory cell but is not focused on the peripheral portion. Accordingly, the line width of the metal interconnection may be increased or varied, so that the line width of the metal interconnection cannot be formed as designed, which results in an inferior interconnection.

In order to eliminate the above problems, the poly-Si film which constitutes the floating gate 54 should be made to be thin. However, it is very difficult to grow a thin poly-Si film having a uniform thickness in the range of 40 to 50 nm on the tunnel oxide film 53. Such a thin poly-Si film may tend to cause local ultra-thin portions, so that large differences in levels can be observed microscopically. Moreover, it is very difficult to diffuse impurities in such a thin poly-Si film having a microscopically nonuniform thicknesses. The reason is that, in the case of ion implantation, the implanted ions locally pass through the poly-Si film and reach the underlying tunnel oxide film 53. This causes damage in the tunnel oxide film 53, and deteriorates the reliability of the electric insulating property. In the case where $POCl_3$ is diffused in the poly-Si film, the phosphorous concentration is locally increased in the poly-Si film, so that the reliability of the electric insulating property of the tunnel oxide film 53 is also deteriorated.

As a fabrication method of a silicon film which constitutes the floating gate 54, a method utilizing an amorphous silicon film instead of the poly-Si film is known. Japanese Laid-Open Patent Publication No. 1-13771 describes a method in which an amorphous silicon film is deposited, and then crystallization is performed from the seed region by annealing, whereby the floating gate is formed of a single crystal silicon film. However, the above-identified publication does not mention how thick the floating gate is, whether the doping is performed or not, and the like.

Japanese Laid-Open Patent Publication No. 1-129465 describes a method in which the floating gate is formed to have a two-layer structure including a poly-Si film and an amorphous silicon film. In this prior art, the amorphous silicon film has a thickness of several tens of nanometers, and the poly-Si film is thicker than the amorphous silicon film. After the two-layer structure is formed, phosphorus is thermally diffused.

Japanese Laid-Open Patent Publication No. 2-31467 describes a method in which the floating gate is formed of a non-doped poly-Si film. In this prior art, the poly-Si film has a large thickness of 250 nm, so that the voltage drop at the floating gate is large. Thus, the voltage required for the writing and erasing for the memory cell is increased. Even if the poly-Si film is oxidized for growing grains, the following problem arises.

In the poly-Si film, there are many interface states in the grain boundary. Its average density is more than $10^{17}/cm^3$. Accordingly, if a weak electric field of about 3 MV/cm is applied to the surface of the floating gate, for example, a depletion layer having a thickness of 60 nm or more is generated in the floating gate surface, and a voltage drop of several voltages or more occurs. As a result, it is necessary to apply an excess voltage corresponding to the voltage drop to the control gate. As described above, the use of such a thick non-doped poly-Si film as the floating gate in a flash memory, an EPPROM, or the like complicates the construction of the power supply section of the peripheral portion, and causes the consumed power to increase. As an example, if the floating gate is formed of a non-doped single crystal silicon film, the floating gate itself is depleted, so that there occurs a voltage drop of about 25 V.

SUMMARY OF THE INVENTION

The nonvolatile memory cell of the invention includes: a semiconductor substrate; a source region and a drain region formed in the semiconductor substrate; a first insulating film formed on the semiconductor substrate; a floating gate formed on the first insulating film; a second insulating film formed on the floating gate; and a control gate formed on the second insulating film, wherein the floating gate is formed of a polycrystalline silicon film which is obtained by crystallizing an amorphous silicon film, and the floating gate has a thickness of 55 nm or less.

In one embodiment of the invention, the thickness of the floating gate is 40 nm or less.

In another embodiment of the invention, the floating gate is formed of a polycrystalline silicon thin film having an impurity concentration of substantially $1 \times 10^{19}/cm^3$ or less.

In another embodiment of the invention, the floating gate is formed of a non-doped polycrystalline silicon thin film.

In another embodiment of the invention, the thickness of the floating gate is in the range of 3 nm to 33 nm.

In another embodiment of the invention, the thickness of the floating gate is in the range of 3 nm to 15 nm.

According to another aspect of the invention, the nonvolatile memory cell includes: a semiconductor substrate;

a source region and a drain region formed in the semiconductor substrate; a first insulating film formed on the semiconductor substrate; a floating gate formed on the first insulating film; a second insulating film formed on the floating gate, the second insulating film being an oxide film; and a control gate formed on the second insulating film, wherein the floating gate is formed of a polycrystalline silicon film which is obtained by crystallizing an amorphous silicon film, and the floating gate has a thickness of 55 nm or less.

In one embodiment of the invention, the thickness of the floating gate is 40 nm or less.

In another embodiment of the invention, the floating gate is formed of a polycrystalline silicon thin film having an impurity concentration of substantially $1\times10^{19}/cm^3$ or less.

In another embodiment of the invention, the floating gate is formed of a non-doped polycrystalline silicon thin film.

In another embodiment of the invention, the thickness of the floating gate is in the range of 3 nm to 33 nm.

In another embodiment of the invention, the thickness of the floating gate is in the range of 3 nm to 15 nm.

According to still another aspect of the invention, the nonvolatile memory cell includes: a semiconductor substrate;

a source region and a drain region formed in the semiconductor substrate; a first insulating film formed on the semiconductor substrate; a floating gate formed on the first insulating film; a second insulating film formed on the floating gate; and a control gate formed on the second insulating film, wherein the floating gate is formed of a polycrystalline silicon film having an impurity concentration of $1\times10^{19}/cm^3$ or less, and the floating gate has a thickness of 33 nm or less.

In one embodiment of the invention, the second insulating film is an oxide film formed on a surface of the polycrystalline silicon film.

In another embodiment of the invention, the thickness of the floating gate is in the range of 3 nm to 15 nm.

In another embodiment of the invention, the second insulating film includes a nitride film formed on a surface of the polycrystalline silicon film.

According to still another aspect of the invention, a method of producing a nonvolatile memory cell is provided. The method includes the steps of: forming a first insulating film on a semiconductor substrate; forming a floating gate having a thickness of 55 nm or less on the first insulating film; forming a second insulating film on the floating gate; and forming a control gate on the second insulating film, wherein the step of forming the floating gate includes the steps of: depositing an amorphous silicon film on the first insulating film; re-crystallizing the amorphous silicon film by annealing to form a polycrystalline silicon film; and forming the floating gate from the polycrystalline silicon film.

In one embodiment of the invention, the step of forming the floating gate from the polycrystalline silicon film includes a step of depositing an oxidation resistant film on the polycrystalline silicon film, a step of patterning the oxidation resistant film into a predetermined shape, and a step of selectively oxidizing part of the polycrystalline silicon film using the patterned oxidation resistant film as a mask.

In another embodiment of the invention, the annealing includes a first annealing step at a first predetermined temperature and a second annealing step at a second predetermined temperature, the second predetermined temperature being higher than the first predetermined temperature.

The floating gate of a nonvolatile memory cell element according to the invention is thinner than any other conventional floating gates. Such a thin floating gate can be formed by making a thin amorphous silicon film polycrystalline by solid phase growth. The thin silicon film formed according to the invention has a high uniformity in thickness in a microscopic area. Therefore, according to the invention, an ultrathin poly-Si film (specifically, a poly-Si film having a thickness of 40 nm or less) can be used as the floating gate.

By making the floating gate ultra-thin, it is possible to reduce the etching amount of the element isolating film in a second insulating film processing step. Accordingly, the overlap amount of the floating gate on the field oxide film in the semiconductor substrate can be reduced, so that the size of nonvolatile memories can be easily reduced. In addition, by decreasing the thickness of the floating gate, the focus margin for exposure is increased, so that the production can be readily performed and the production yield is increased.

Moreover, the poly-Si film is seen as a single crystal grain with respect to the film-thickness direction, so that an oxide film with a high breakdown voltage can be formed by thermal oxidation. Accordingly, it is possible to form a second insulating film between the floating gate and the control gate by thermal oxidizing the floating gate. As a result, a thin insulating film can be formed. Whereas, it is difficult to form such a thin insulating film in the case of an ONO film ($SiO_2$, $SiN.SiO_2$) which is used as the conventional insulating film, because the film quality of SiN is inferior to $SiO_2$ and hence the film thickness can be 13 nm at the most.

By forming the floating gate of a ultra-thin film, the voltage loss is small even in the case where the ultra-thin film is a non-doped film. Also, the impurity diffusion step to the thin poly-Si film can be omitted, so that the production can be readily performed. When the floating gate is formed of a ultrathin non-doped poly-Si film, the program speed is remarkably increased and power consumption is reduced.

Furthermore, the floating gate is patterned and formed by selective oxidation, so that it is unnecessary to perform the etching of the second insulating film on the stepped portion of the floating gate. Thus, the overlap amount between the first oxide film and the floating gate can be eliminated.

Thus, the invention described herein makes possible the advantage of providing a nonvolatile memory cell with enhanced reliability which is suitable for minimization and can be easily produced, and a method of producing the nonvolatile memory cell.

This and other advantages of the present invention will become apparent to those skilled in the art upon reading and understanding the following detailed description with reference to the accompanying figures.

BRIEF DESCRIPTION OF THE DRAWINGS

FIGS. 6A and 6B are cross-sectional views for illustrating production steps of the memory cell of this example.

FIGS. 7A and 7B are cross-sectional views for illustrating production steps of the memory cell of this example.

FIG. 18 is a process chart illustrating the production steps of this example.

FIG. 19 is a process chart illustrating the production steps of this example.

DESCRIPTION OF THE PREFERRED EMBODIMENTS

EXAMPLE 1

A nonvolatile memory cell according to the invention will be described below with reference to FIGS. 1 to 3. Herein, a flash memory is described as an example of a device including a nonvolatile memory cell of the invention.

Figure 1:
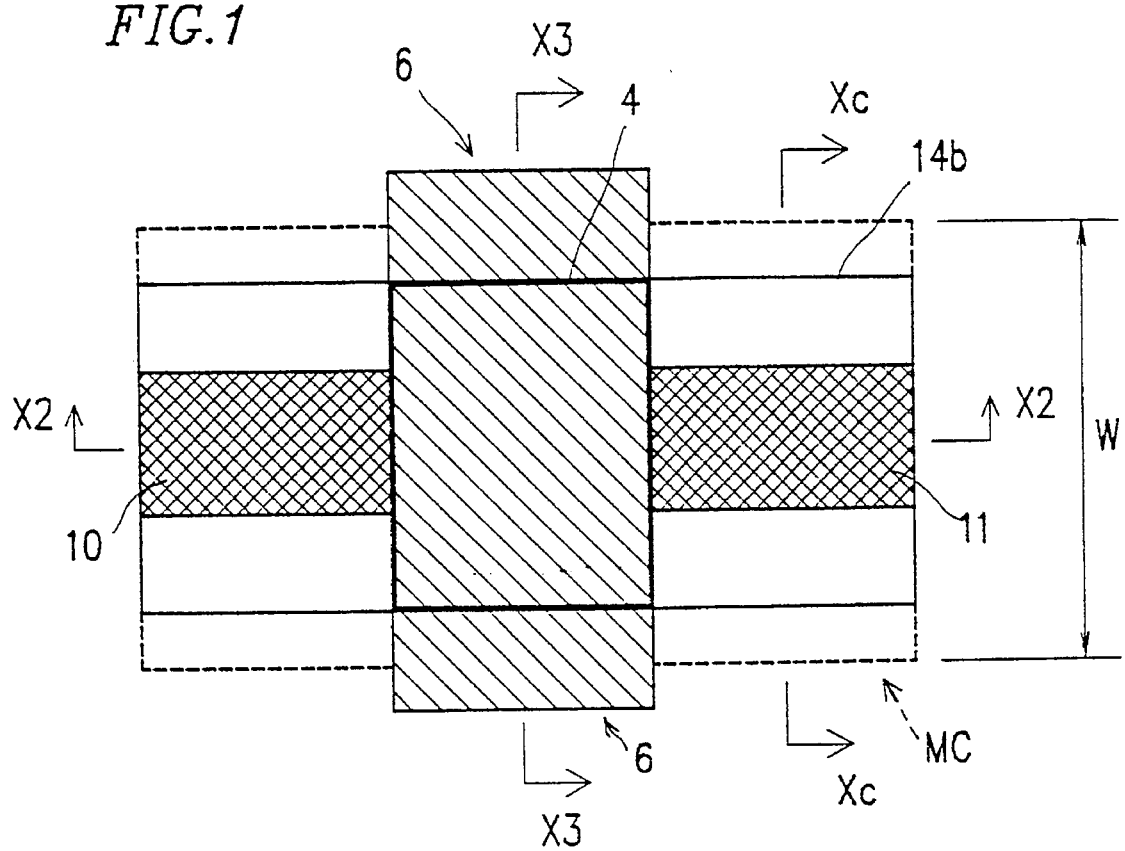
FIG. 1 is a plan view showing a memory cell MC of a flash memory in one example of the invention.
Figure 2:
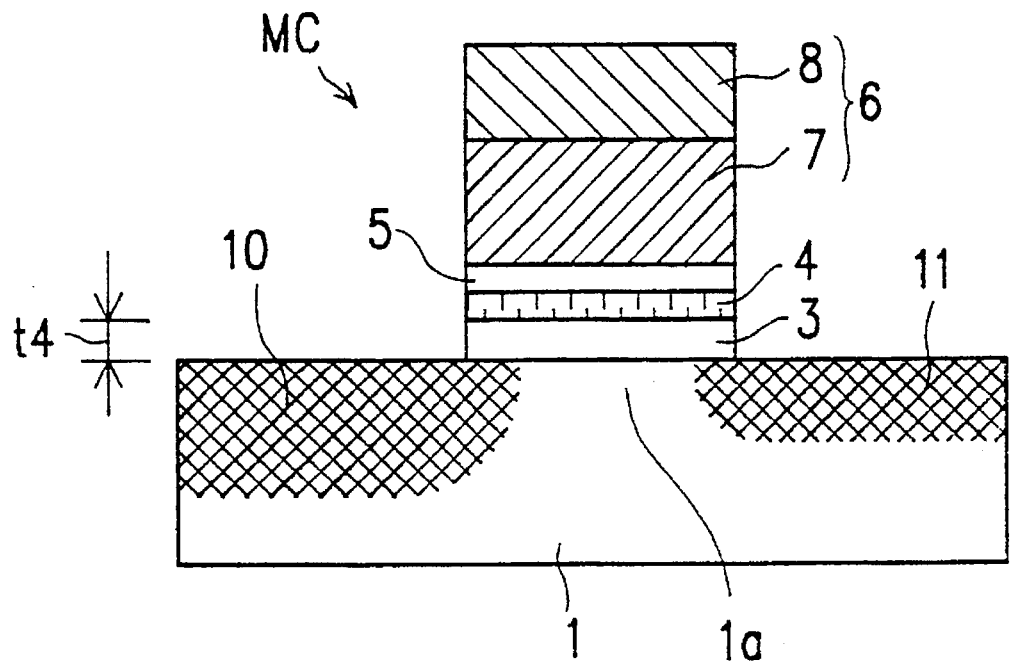
FIG. 2 is a cross-sectional view taken along the line X2—X2 in FIG. 1.
Figure 3:
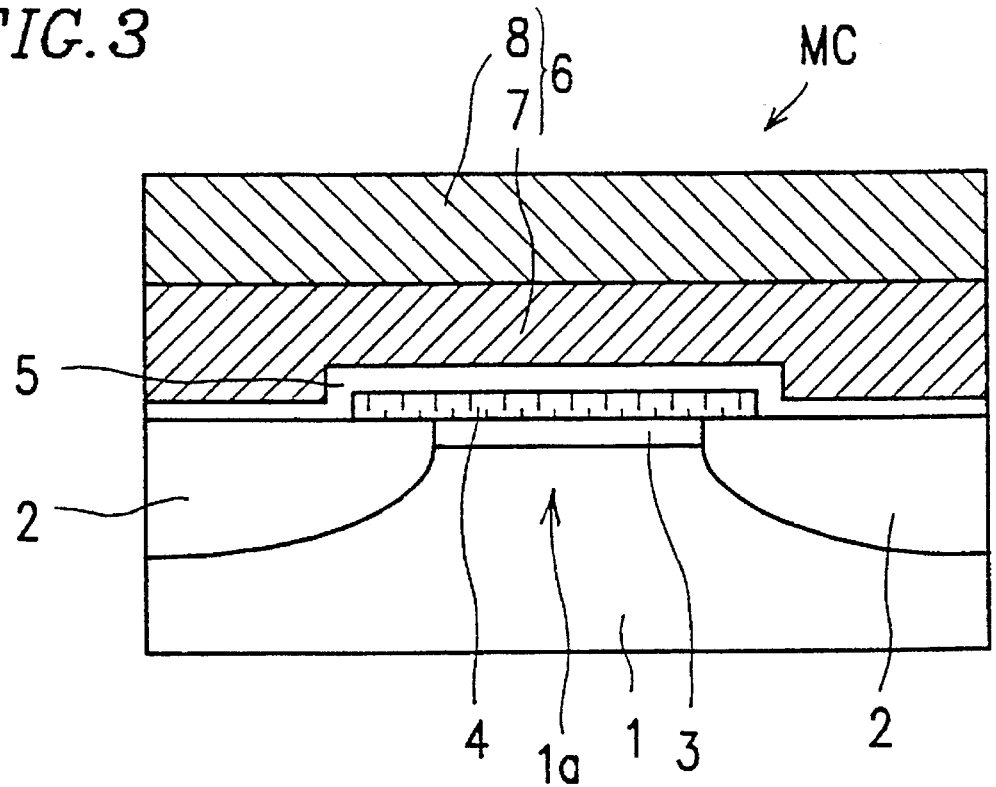
FIG. 3 is a cross-sectional view taken along the line X3—X3.

FIG. 1 is a plan view showing a nonvolatile memory cell MC of the invention, FIG. 2 is a cross-sectional view taken along the line X2—X2 in FIG. 1, and FIG. 3 is a cross-sectional view taken along the line X3—X3.

A flash memory includes a number of memory cells. For simplicity, these figures only show one memory cell MC. A control gate 6 shown in the figures functions as a control gate line for a plurality of memory cells. A floating gate 4 is individually provided for each memory cell, and in an electrically floating state.

The surface of a silicon substrate 1 is divided into a plurality of active regions, and element isolating regions for isolating the active regions from each other. In the element isolating region of the silicon substrate 1, as is shown in FIG. 3, a field oxide film (a LOCOS film) 2 is formed. In this example, for the purpose of reducing the unevenness of the surface, a recess-type LOCOS film 2 is used. In the active region 1a of the silicon substrate 1, as is shown in FIG. 2, a source region 10 and a drain region 11 are provided. On the active region 1a of the silicon substrate 1, a tunnel oxide film (a first insulating film) 3 made of $SiO_2$, a floating gate 4, an ONO insulating film (a second insulating film) 5, and a control gate 6 are successively formed in this order. The control gate 6 has a polycide structure including an $N^+$ poly-Si film 7 as a lower layer and a $WSi_x$ film 8 as an upper film.

In the flash memory of a NOR type, a bit line (not shown) which is a common line for a plurality of memory cells MC is connected to the drain region 11 of the memory cell MC. The source region 10 itself extends as a diffused layer interconnection in parallel to a direction along which the control gate 6 extends. The diffused layer interconnection serves as a common interconnection (a common source region) between a plurality of memory cells MC.

One of significant features of the memory cell in this example resides in that the floating gate 4 is formed of a ultra-thin poly-Si film. This feature can attain various advantages which will be described later. In this example, a poly-Si-film which is to be a floating gate 4 is first processed so as to have a shape extending in a traverse direction of FIG. 1, thereby obtaining a poly-Si film 14b having a width W. At this stage, the poly-Si film 14b completely covers the active region 1a of the silicon substrate 1, and covers part of the field oxide film 2. Thereafter, when a polycide film is patterned to form a control gate 6, part of the poly-Si film 14b is also etched so as to form a floating gate 4. As a result, the floating gate 4 is formed only in an overlapping portion between the poly-Si film 14b and the control gate 6, as is shown in FIG. 1. In this way, the position and the shape of the floating gate 4 is self-aligned with the control gate 6 as is shown in FIG. 2.

Figure 12A:
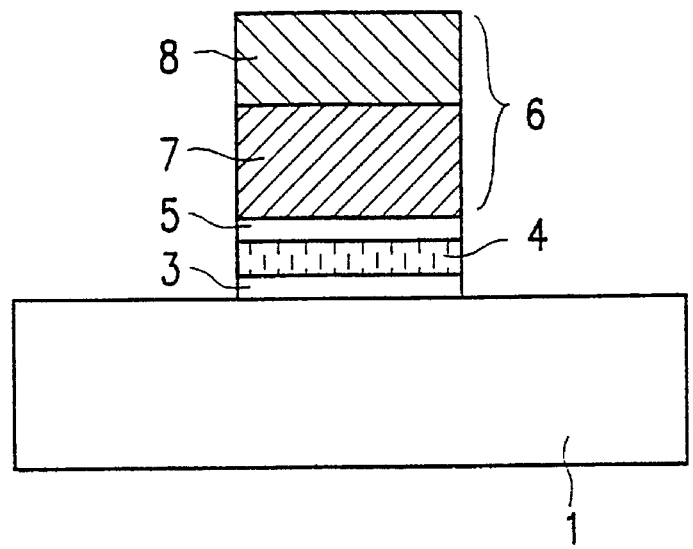
FIGS. 12A, 12B, and 12C are cross-sectional views for illustrating production steps of the memory cell of this example.
Figure 12B:
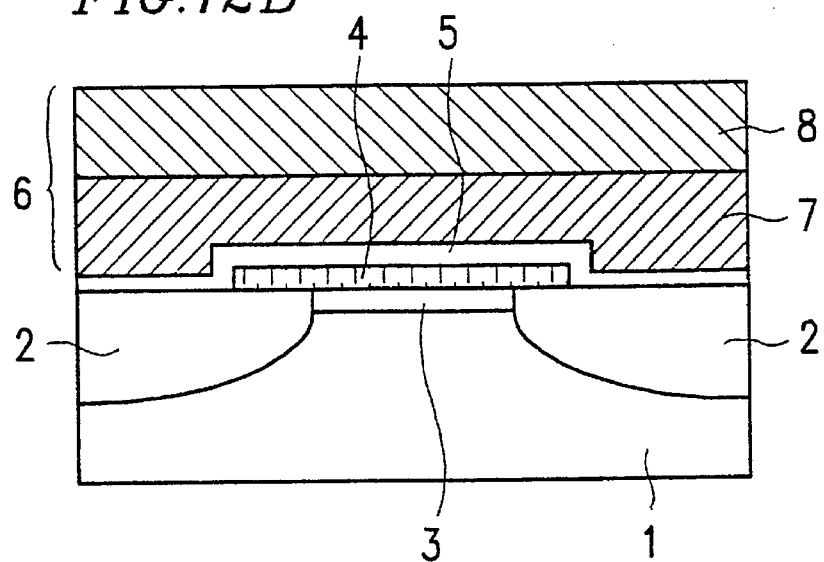
Figure 12C:
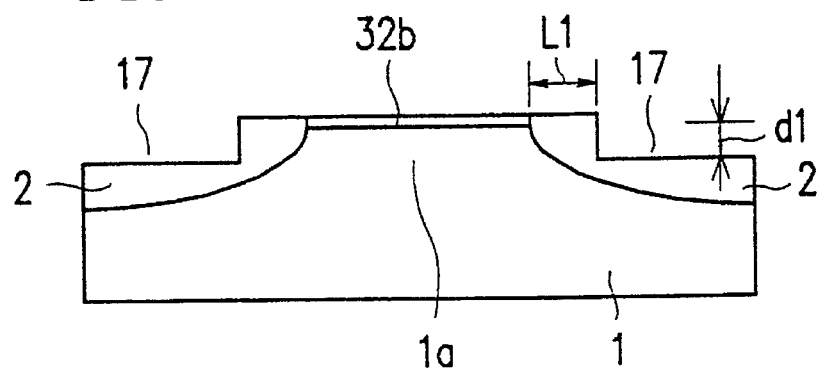
Figure 13A:
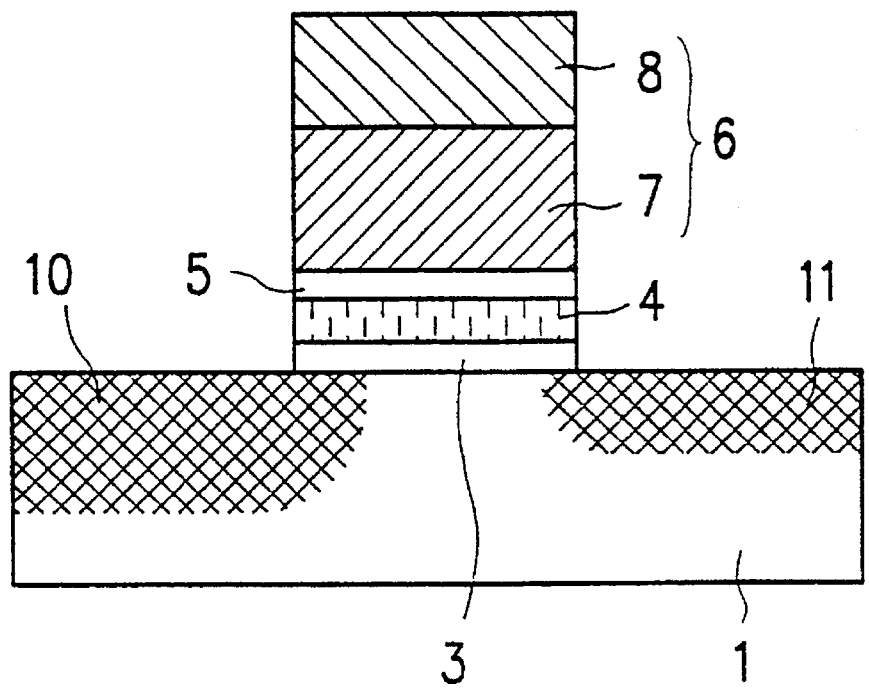
FIGS. 13A and 13B are cross-sectional views for illustrating production steps of the memory cell of this example.
Figure 13B:
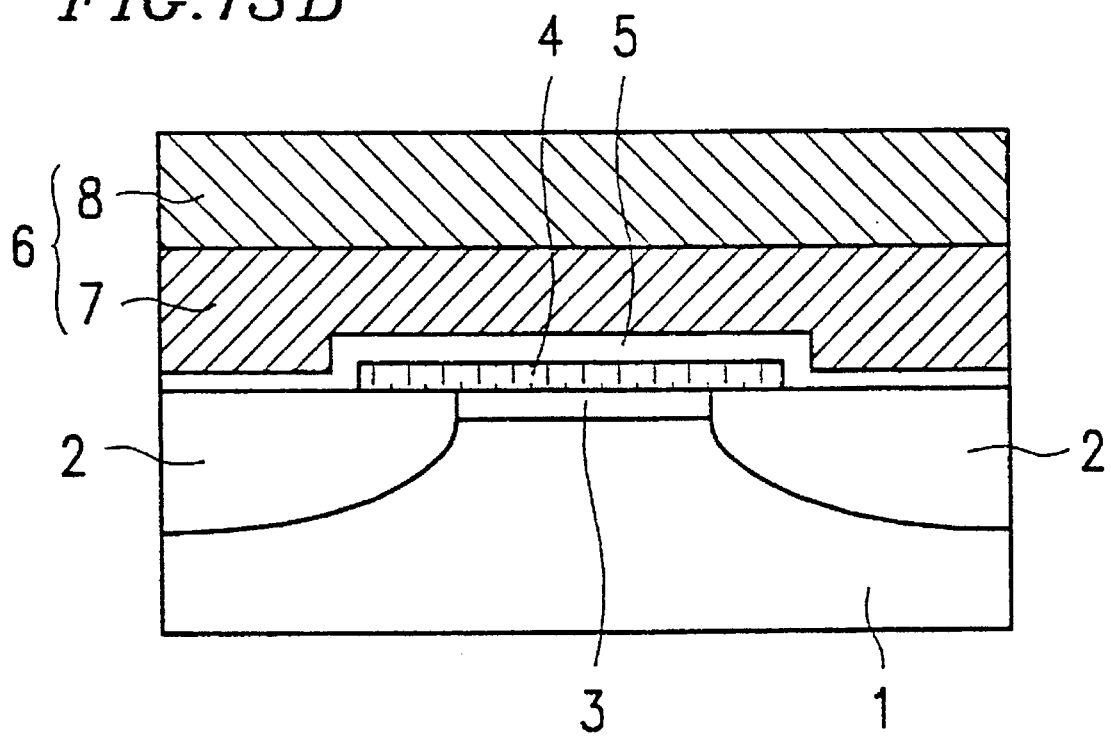
Figure 14:
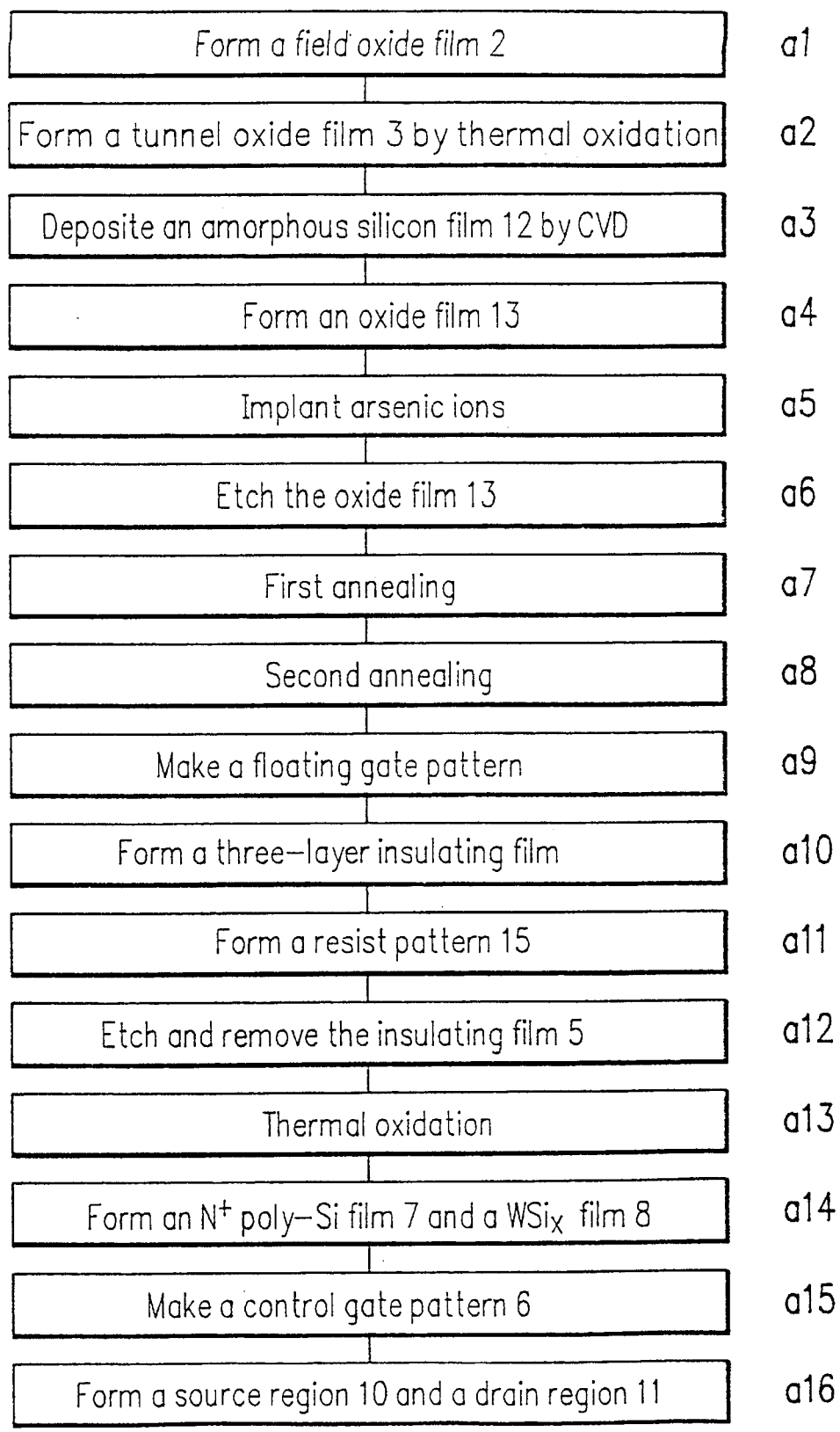
FIG. 14 is a process chart showing production steps of this example.

Next, referring to FIGS. 4A through 14, a method of producing the memory cell of this example is described. FIGS. 4A, 5A, 6A, 7A, 8A, 9A, 10A, 11A, 12A, and 13A are cross-sectional views corresponding to the cross section taken along the line X2—X2 in FIG. 1. FIGS. 4B, 5B, 6B, 7B, 8B, 9B, 10B, 11B, 12B, and 13B are cross-sectional views corresponding to the cross section taken along the line X3—X3 in FIG. 1. FIGS. 10C and 11C are cross-sectional views showing a peripheral circuit portion of the memory cell MC. FIG. 12C is a cross-sectional view taken along the line Xc—Xc in FIG. 1. FIG. 14 is a process chart illustrating production steps of this example.

Figure 4A:
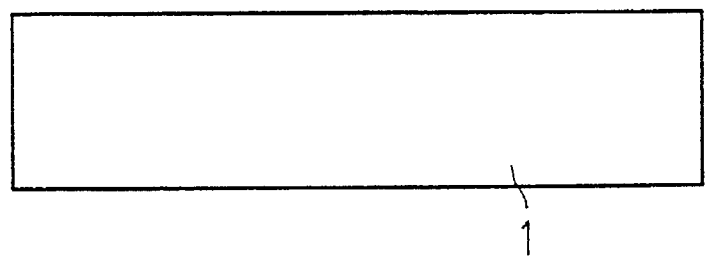
FIGS. 4A and 4B are cross-sectional views for illustrating production steps of the memory cell of this example.
Figure 4B:
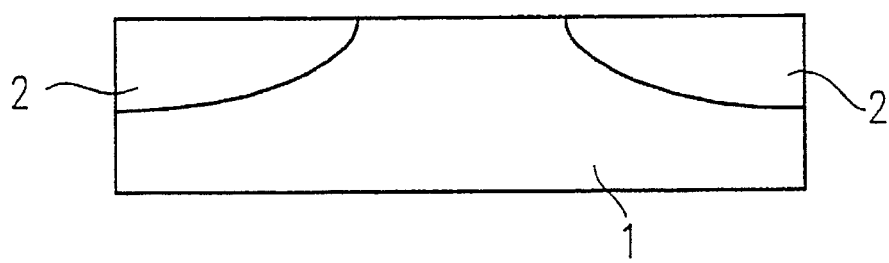
Figure 5A:
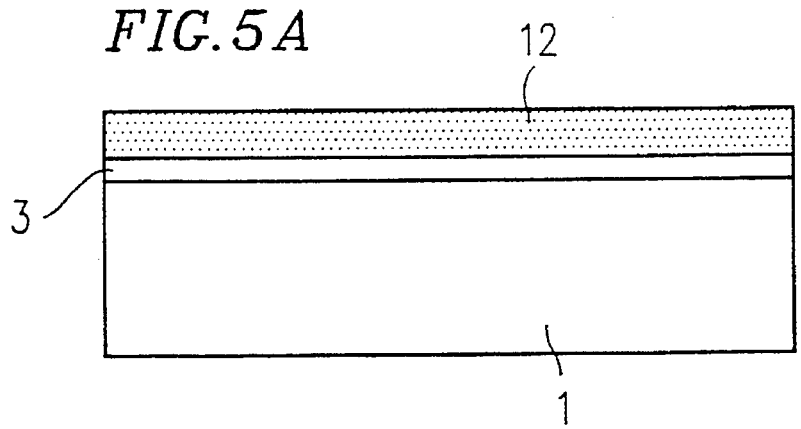
FIGS. 5A and 5B are cross-sectional views for illustrating production steps of the memory cell of this example.
Figure 5B:
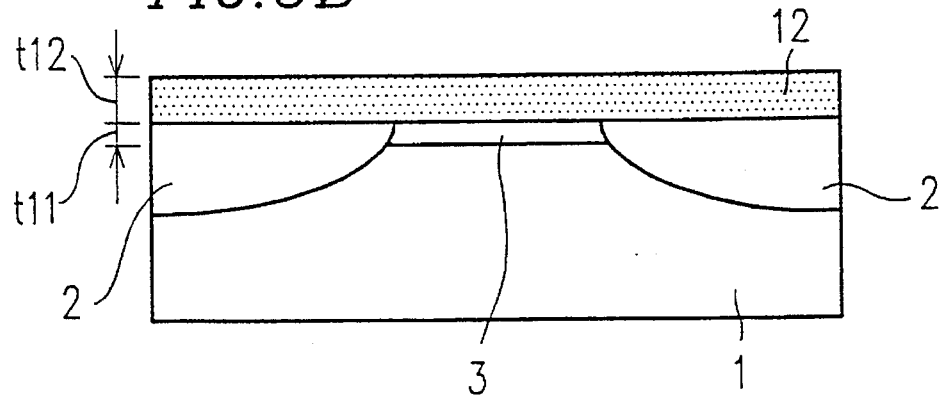

As is shown in FIGS. 4A and 4B, a field oxide film (LOCOS film) 2 is selectively formed in an element isolating region in the surface of a P-type silicon substrate 1 (step a1). Next, as is shown in FIGS. 5A and 5B, after a tunnel oxide film 3 is formed on the silicon substrate 1 (step a2), an amorphous silicon film 12 is deposited on the tunnel oxide film 3 (step a3). The tunnel oxide film 3 is formed by, for example, thermally oxidizing an exposed surface (1a) of the silicon substrate 1. It is preferable to set the thickness t11 of the tunnel oxide film 3 in the range of about 8 to 12 nm. In this example, the thickness t11 was set to be 10 nm.

It is preferable to set the thickness t12 of the amorphous silicon film 12 in the range of about 10 to 40 nm. In this example, the thickness t12 was set to be 32 nm. The amorphous silicon film 12 is required to be a film having a uniform thickness in a microscopic area having a size corresponding to the thickness t12. For this reason, in this example, the amorphous silicon film 12 was formed by the following method. Specifically, a non-doped amorphous silicon film 12 is grown at a temperature of about 550° C. by low pressure CVD (LPCVD) using silane ($SiH_4$) as a material gas. Alternatively, the amorphous silicon film 12 may be formed at a temperature of about 500° C. by LPCVD using disilane ($Si_2H_6$) as a material gas. It was confirmed that the thus deposited amorphous silicon film 12 satisfied the above conditions.

Next, as is shown in FIGS. 6A and 6B, after an oxide film 13 having a thickness t13 of about 15 nm is formed on the amorphous silicon film 12 (step a4), arsenic ions are implanted to the amorphous silicon film 12 (step a5). The implantation energy is set so that the arsenic ions do not reach the tunnel oxide film 3, and the implantation dose is set so that the average concentration of the arsenic ions at the completion of the floating gate 4 is in the range of about $3\times10^{19}$ to $3\times10^{20}$ cm$^3$. In this example, the implantation energy was 20 KeV, and the implantation dose was $3\times10^{14}$/cm$^2$. The purposes of the ion implantation are to reduce the thickness of the depletion layer which is formed in the floating gate 4 and to reduce the voltage drop at the floating gate 4 when a voltage is applied to the control gate 6. The implanted impurity may alternatively be phosphorus or Boron.

Next, the oxide film 13 is etched by an HF solution (step a6). The oxide film 13 has a function for making the depth of ion implantation not exceed a desired range in the ion implantation step. Accordingly, after the ion implantation, the oxide film 13 is not necessary.

Next, the amorphous silicon film 12 is crystallized by annealing, so as to obtain a poly-Si film 14a, as is shown in FIGS. 7A and 7B. More specifically, a first annealing is performed at 600° C. for 24 hours in a nitrogen atmosphere, so that the solid state growth of the amorphous silicon film 12 is performed (step a7). Then, a second annealing is performed at 900° C. (step a8). The temperature for the first annealing step may be in the range of about 550° C. to 650° C. The second annealing step may be performed in the nitrogen atmosphere or in a nitrogen atmosphere to which a small amount of oxygen is added. The temperature for the second annealing step may be in the range of 800° C. to 1000° C. As the result of these annealing steps, the poly-Si film 14a is formed. If the second annealing step is performed in an oxygen atmosphere, an oxide film having a thickness in the range of 5 to 20 nm is inevitably formed on the surface of the poly-Si film 14a. The oxide film is eventually etched away by an HF solution or the like.

Prior to the annealing for polycrystallization, it is unnecessary to remove the oxide film 13. The oxide film 13 may be removed after the annealing. The ion implantation to the amorphous silicon film 12 for the impurity doping to the floating gate 4 is merely an example. Alternatively, after the annealing for crystallization of the amorphous silicon film 12, PSG (Phosphosilicate Glass), BSG (Borosilicate Glass), or the like may be deposited on the poly-Si film 14a, and then the annealing is performed, thereby diffusing the phosphorus or boron n the PSG, BSG, or the like in the poly-Si film 14a.

Figure 8A:
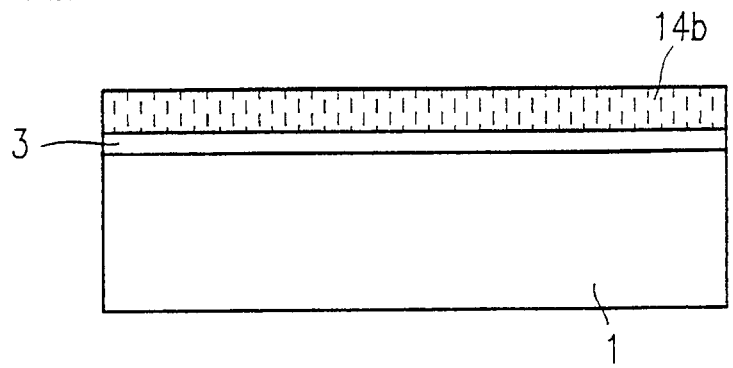
FIGS. 8A and 8B are cross-sectional views for illustrating production steps of the memory cell of this example.
Figure 8B:
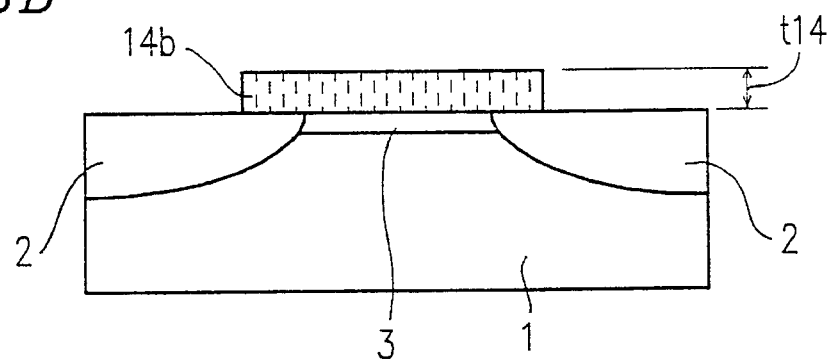

Next, as is shown in FIGS. 8A and 8B, the poly-Si film 14a is patterned so as to obtain a poly-Si film 14b (step a9). This patterning can be performed by known lithography and etching techniques. The poly-Si film 14b finally serves as the floating gate 4 having a thickness t14 (e.g., 30 nm).

Figure 9A:
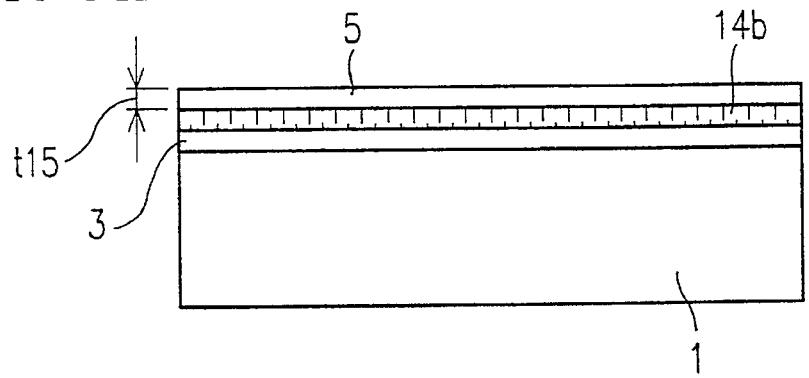
FIGS. 9A and 9B are cross-sectional views for illustrating production steps of the memory cell of this example.
Figure 9B:
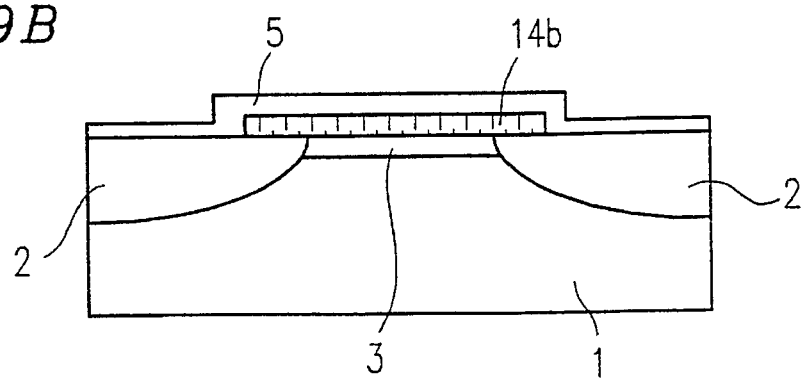

The surface of the poly-Si film 14b is thermally oxidized, thereby growing a first oxide film having a thickness of about 5 nm on the surface of the poly-Si film 14b. Thereafter, a silicon nitride film (thickness: 10 nm) is deposited by LPCVD. Thereon, a second oxide film (referred to as an HTO) is deposited so as to have a thickness of 5 nm by LPCVD (step a10). As a result, as is shown in FIGS. 9A and 9B, an ONO insulating film (having three-layered structure) 5 having a thickness t15 (e.g., 20 nm) is formed on the poly-Si film 14b. In this example, the silicon nitride film and the second oxide film of the ONO insulating film 5 are formed so as to cover the entire surface of the silicon substrate 1 by CVD. The first oxide film is selectively formed on the poly-Si film 14b by thermal oxidation. However, for simplicity, the entire ONO insulating film 5 is shown so as to cover the entire surface of the silicon substrate 1 in the figures.

The first oxide film constituting the ONO insulating film 5 may be formed of an HTO. In the case where the first oxide film is formed by oxidizing the poly-Si film 14b, it is preferred to use dry oxidation in order to form an ultra-thin first oxide film with good controllability. The silicon nitride film constituting the ONO insulating film 5 can be formed at a temperature in the range of 600° C. to 800° C. by using $SiCl_2H_2$ and $NH_3$ as material gases. The second oxide film constituting the ONO insulating film 5 can be formed at a temperature in the range of 700° C. to 900° C. using $SiH_4$ and $N_2O$ as material gases. The material gases may alternatively be $SiCl_2H_2$ and $N_2O$.

Instead of the ONO insulating film 5, an insulating film of a single-layer thermal oxide film can be used. The case where the insulating film of the single-layer thermal oxide film is used instead of the ONO insulating film 5 will be described in detail in Example 4.

Figure 10A:
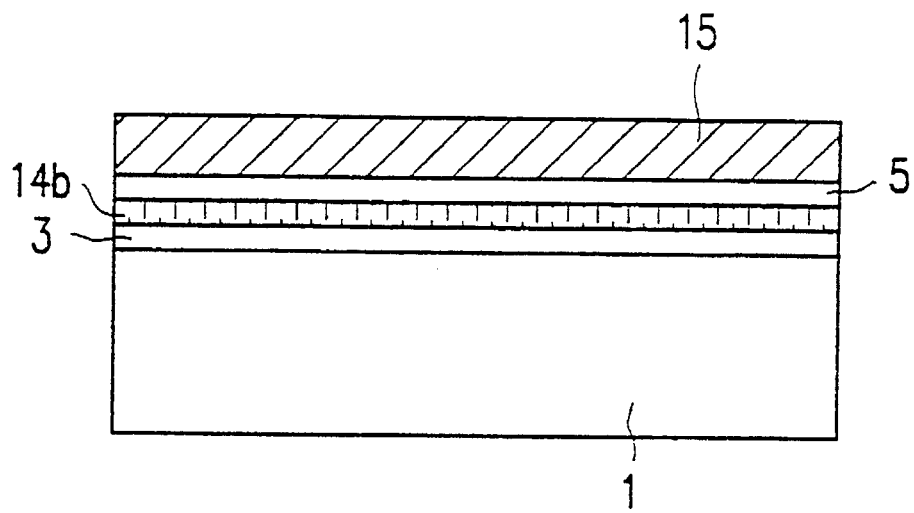
FIGS. 10A, 10B, and 10C are cross-sectional views for illustrating production steps of the memory cell of this example.
Figure 10B:
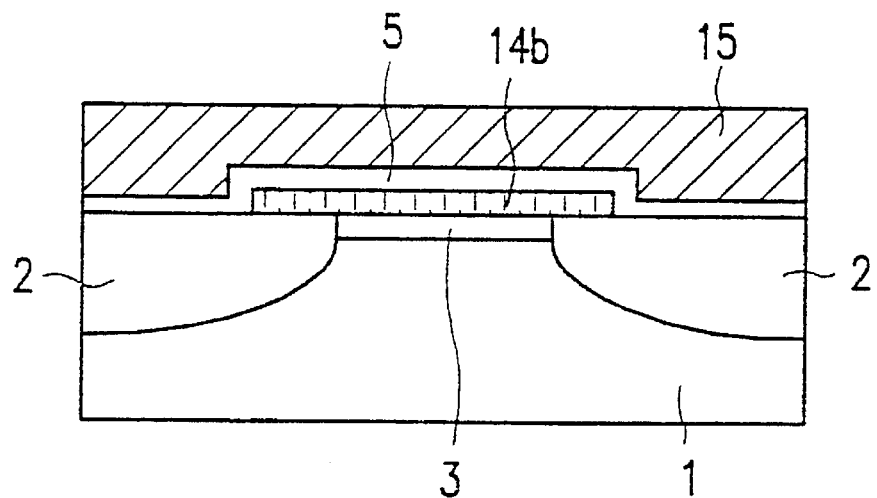
Figure 10C:
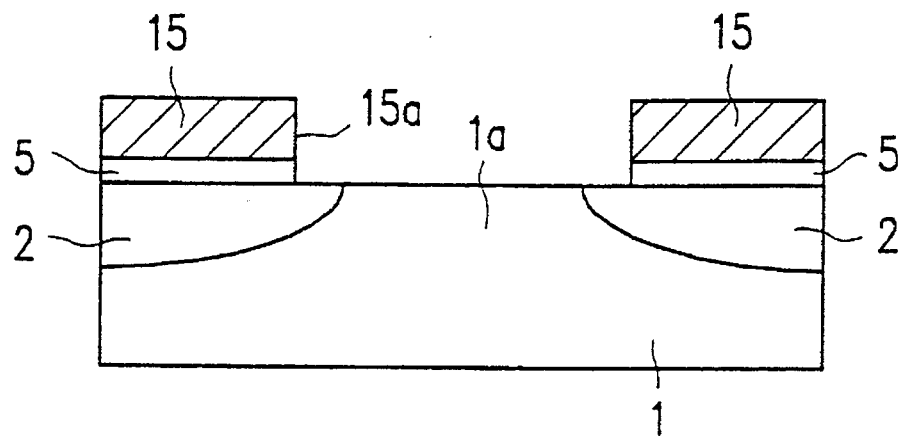

In this example, a transistor formed in the peripheral circuit portion of the memory cell array is formed along with the production steps of the nonvolatile memory cell. In the stage immediately after the ONO insulating film 5 is formed, a resist pattern 15 is formed (step a11), FIG. 14 as is shown in FIGS. 10A and 10B, in order to form a gate oxide film 32b of the transistor in the peripheral circuit portion (FIG. 11C). As is shown in FIG. 10C, the resist pattern 15 has an opening 15a on the active region 1a of the peripheral circuit portion. Next, portions of ONO insulating film 5 which are exposed through the opening 15a are selectively etched and removed, so as to expose the active region 1a of the peripheral circuit portion (step a12). After the resist pattern 15 is removed, the surface of the active region 1a of the peripheral portion is thermally oxidized, so as to form the gate insulating film 32b (FIG. 11C) (step a13). Due to the thermal oxidation, the thickness of the ONO insulating film 5 is slightly increased. The final equivalent oxide thickness of the ONO insulating film 5 is 16 nm.

Figure 11A:
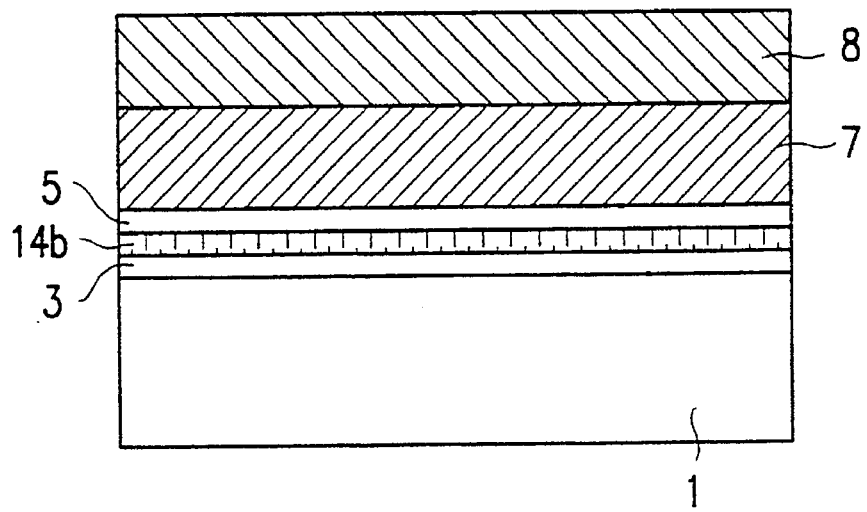
FIGS. 11A, 11B, and 11C are cross-sectional views for illustrating production steps of the memory cell of this example.
Figure 11B:
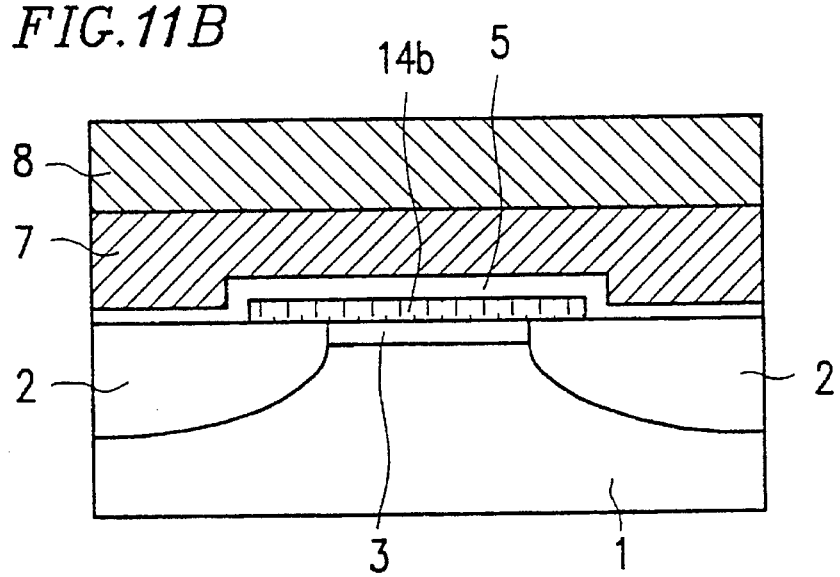
Figure 11C:
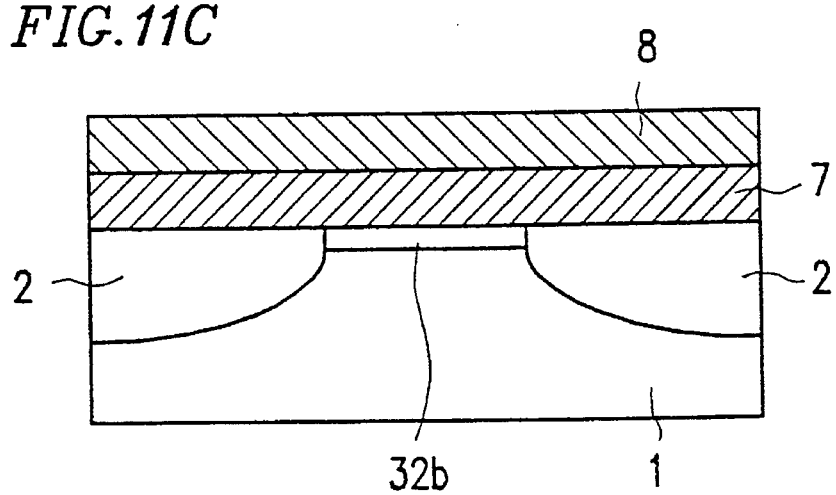

Next, as is shown in FIGS. 11A, 11B, and 11C, an $N^+$ poly-Si film 7 and a $WSi_x$ film 8 are successively formed, so as to obtain a polycide structure (step a14). Thereafter, as is shown in FIGS. 12A and 12B, the $WSi_x$ film 8 and the $N^+$ poly-Si film 7 are successively patterned so as to obtain a control gate 6 (step a15). Following this, the ONO insulating film 5 is etched. As described above, in order to completely remove the portions of the ONO insulating film 5 positioned on the sides of the poly-Si film 14b, it is necessary to perform the etching for a time period sufficient for etching an ONO insulating film having a thickness equal to the sum of the thickness of the poly-Si film 14b (the thickness of the floating gate 4) and the thickness of the ONO insulating film 5. The etching gas for the etching of the ONO insulating film 5 may etch the material ($SiO_2$) used for the field oxide film 2. As a result, an upper portion of the field oxide film 2 in a region which is not covered with the poly-Si film 14b is etched during the etching step of the ONO insulating film 5. In particular, as is shown in FIG. 10C, the poly-Si film 14b does not exist in the peripheral circuit portion, so that the field oxide film 2 is exposed after the completion of the etching of polycide and the etching of the ONO insulating film 5 in a flat portion. Thereafter, the field oxide film 2 is etched. However, according to the invention, the poly-Si film 14a is ultra-thin, so that the etching of the field oxide film is remarkably reduced.

After the etching of the ONO insulating film 5, the poly-Si film 14b is etched. By the etching of the poly-Si film 14b, the formation of the floating gate 4 is completed. At the time when the formation of the floating gate 4 is finished, portions of the active region 1a in which a source region 10 and a drain region 11 are to be formed are substantially exposed.

FIG. 12C is a cross-sectional view corresponding to the cross section taken along the line Xc—Xc in FIG. 1. As is shown in FIG. 12C, a recess 17 with a depth d1 is generated in the field oxide film 2 mainly due to the etching of the ONO insulating film 5. The depth d1 of the recess 17 corresponds to a sum of the thickness t14 of the floating gate 4 and the over-etched amount of the ONO insulating film 5. In this example, since the thickness t14 of the floating gate 4 is only about 30 nm, the depth d1 of the recess 17 can be suppressed to be as deep as about 50 nm. Accordingly, the overlap amount L1 shown in FIG. 12C between the field oxide film 2 and the floating gate 4 may be about 40 nm at the most. If the alignment margin of the floating gate 4 with respect to the field oxide film 2 is set to be 150 nm, the required overlap margin at the pattern design of the floating gate 4 may be 200 nm at the most. Accordingly, it is possible to provide a nonvolatile memory cell with a reduced size.

Next, by using a known method, as is shown in FIGS. 13A and 13B, the source region 10 and the drain region 11 are formed (step a16), FIG. 14.

The flash memory having memory cells MC which are formed through the above production steps has a layered structure of the control gate 6, the ONO insulating film (the thickness t15 is about 21 nm) 5, the floating gate (the thickness t14 is about 30 nm) 4, and the tunnel oxide film (the thickness t11 is 10 nm) 3.

According to the invention, after the ultrathin amorphous silicon film 12 having a uniform thickness with unevenness in a nanometer order is deposited, the amorphous silicon film 12 is poly-crystallized. As a result, it is possible to stably form the ultra-thin poly-Si film 14. This can make the thickness t14 of the floating gate 4 to be 40 nm or less. Therefore, the etched depth of the field oxide film 2 occurring in the etching step of the ONO insulating film 5 is about 50 nm or less, so that the overlap margin between the floating gate 4 and the field oxide film 2 is reduced to be about 200 nm or less as compared with the conventional overlap margin of 300 nm.

In the flash memory of this example, the floating gate 4 exists in the memory cell array, so that the memory cell array is higher than the peripheral circuit portion of the flash memory cell array by the sum of at least the thicknesses of the floating gate 4 and the control gate 6. The metal interconnection which connects the memory cell array to the peripheral circuit portion is formed over the height difference at the boundary between the memory cell array and the peripheral circuit portion. In this example, the height difference between the memory cell array and the peripheral circuit portion due to the floating gate 4 can be reduced by about 100 nm as compared with the corresponding height difference in the prior art example, so that the focus depth is improved for the exposure in the photolithography step. Accordingly, when a metal interconnection for connecting the memory cell array portion and the peripheral circuit portion is formed in the flash memory of this invention, the exposure can be performed in substantially the same focusing conditions both in the memory cell array portion and the peripheral circuit portion. Thus, it is possible to easily form a metal interconnection without line breakage and short circuit. Accordingly, the reliability of the flash memory in this example is significantly improved.

As described above, the reliability of the memory cell in this example is improved, and nonvolatile memory cells suitable for high density integration can be provided by decreasing the overlap margin. In addition, in the production of such memory cells, the height difference between the memory cell portion and the peripheral circuit portion can be remarkably reduced as compared with the prior art example, so that the production steps by a photo process for the metal interconnection can be significantly simplified.

EXAMPLE 2

Another nonvolatile memory cell according to the invention will be described.

The construction of the memory cell in this example is basically the same as that of the memory cell shown in FIGS. 1 to 3. The memory cell in this example is different from the memory cell in the first example in that the thin floating gate (thickness: about 10 nm) 4 in this example is formed of a non-doped poly-Si film. Herein, the term "a non-doped poly-Si film" means a poly-Si film to which the impurity doping is not positively performed. By using the non-doped poly-Si film for the floating gate 4, effects which are completely different from those obtained by the nonvolatile memory cell in the previous example can be attained. If the poly-Si film includes impurities of $1 \times 10^{19}/cm^3$ or less, the impurity in the poly-Si film does not sufficiently function as a carrier source (donor or acceptor). The reason is that the poly-Si film has a number of interface states at the grain boundaries, so that most of the carriers are trapped by the interface states. Therefor, in place of the nondoped poly-Si film, a poly-Si film which includes impurities of $1\times10^{19}/cm^3$ or less may be used to attain the same effects. The effects are described below.

Impurities are substantially not doped into the floating gate 4, so that a depletion layer is extended to the entire floating gate 4 in the operation of the memory cell. Thus, the floating gate 4 can be regarded as a dielectric as a whole. The specific dielectric constant (about 12) of Si is three times as high as that of an oxide film ($SiO_2$). Accordingly, if the floating gate (thickness: about 10 nm) 4 is regarded as a dielectric, the equivalent oxide thickness of the floating gate 4 is about 3.3 nm.

In addition, since the resistance of the floating gate 4 is high, a potential gradient may occur in a transverse direction of the floating gate 4. In more detail, in the floating gate 4, a difference may be generated between a potential $V_{fs}$ (with respect to the drain) of a portion positioned above the source region and a potential $V_{fd}$ (with respect to the drain) of a portion positioned above the drain region.

As the potential of the floating gate with respect to the drain becomes larger, the speed in programming is increased. In the conventional nonvolatile memory cell, the potential $V_{fc}$ of the floating gate 4 is strongly influenced by the potential of the source region, and the floating gate 4 has an equal potential over the entire portion in the traverse direction. In this example, since the floating gate 4 has a resistive property, the following relationship is obtained.

Potential $V_{fd}$>Potential $V_{fc}$>Potential $V_{fs}$

As a result, the program speed for the memory cell in this example is twice as high as that in the conventional example.

Next, a capacitance formed between the control gate 6 and the silicon substrate 1 is studied. The magnitude of the capacitance formed between the control gate 6 and the silicon substrate 1 depends on the equivalent oxide thickness of the dielectric positioned between the control gate 6 and the silicon substrate 1 (in the case where other factors are fixed). As the equivalent oxide thickness of the dielectric becomes thin, the capacitance is increased. The thickness t15 of the ONO insulating film 5 in this example is 16 nm, so that the total thickness of the dielectric positioned between the control gate 6 and the tunnel oxide film 3 is about 19 nm in the equivalent oxide thickness. The equivalent oxide thickness is not a great deal different from the equivalent oxide thickness of the ONO insulating film which is conventionally used. Accordingly, if the memory cell in this example is compared with the conventional memory cell, the capacitances between the silicon substrate 1 and the control gate 6 are not too different from each other.

However, if the thickness of the floating gate 4 is increased, the equivalent oxide thickness of the floating gate 4 is also increased. This causes a problem in that the capacitance is increased. Accordingly, in the memory cell of this example in which the floating gate 4 is formed of a non-doped poly-Si film, the floating gate 4 is preferred to have a thickness as small as possible in view of the capacitance. If the thickness of the floating gate 4 is smaller than about 3 nm, an electric charge cannot be sufficiently accumulated. For this reason, it is necessary that the thickness of the floating gate 4 is at least 3 nm or more.

On the other hand, in order to increase the capacitance formed between the control gate 6 and the silicon substrate 1, the equivalent oxide thickness of the insulating film between the floating gate 4 and the control gate 6 should be reduced. The insulating film between the floating gate 4 and the control gate 6 is required to have a thickness equal to or larger than the minimum thickness for preventing the tunneling of a charge. The minimum thickness depends on the material and the structure of the insulating film. The minimum thickness of the $SiO_2$ film is, for example, in the range of about 6 to 8 nm. Whereas, the minimum thickness of the ONO insulating film is, for example, in the range of about 12 to 18 nm (the equivalent oxide thickness, a relatively gentle limit). Therefore, it is found that a single-layer $SiO_2$ film is preferably used instead of the ONO insulating film for the increase of capacitance. If a single-layer $SiO_2$ film is used instead of the ONO insulating film 5, it is possible to reduce the total thickness of the dielectric by an equivalent oxide thickness of 12 nm (=18 nm−6 nm). Thus, the capacitance can be increased by the corresponding amount.

In the memory cell of this example, even though a single-layer $SiO_2$ film is used instead of the ONO insulating film 5, and hence the total thickness of the dielectric film is reduced by an equivalent oxide thickness of, for example, 12 nm (=18 nm−6 nm), the total thickness of the dielectric film is increased by the equivalent oxide thickness of the floating gate 4. Therefore, in view of capacitance, it is preferred not to use a floating gate 4 having an equivalent oxide thickness corresponding to 12 nm. Accordingly, in the case where the floating gate 4 is formed of a non-doped poly-Si film, it is preferred that the thickness of the floating gate 4 is set to be 33 nm or less. This maintains the necessary capacitance even if a single-layer $SiO_2$ film is used instead of the ONO insulating film 5.

The more preferred thickness of the floating gate 4 is 15 nm or less. It was confirmed that if the thickness of the floating gate 4 was 15 nm or less, a larger capacitance than in the conventional example could be obtained either by using the ONO insulating film 5 or by using the single-layer $SiO_2$ film.

Figure 15:
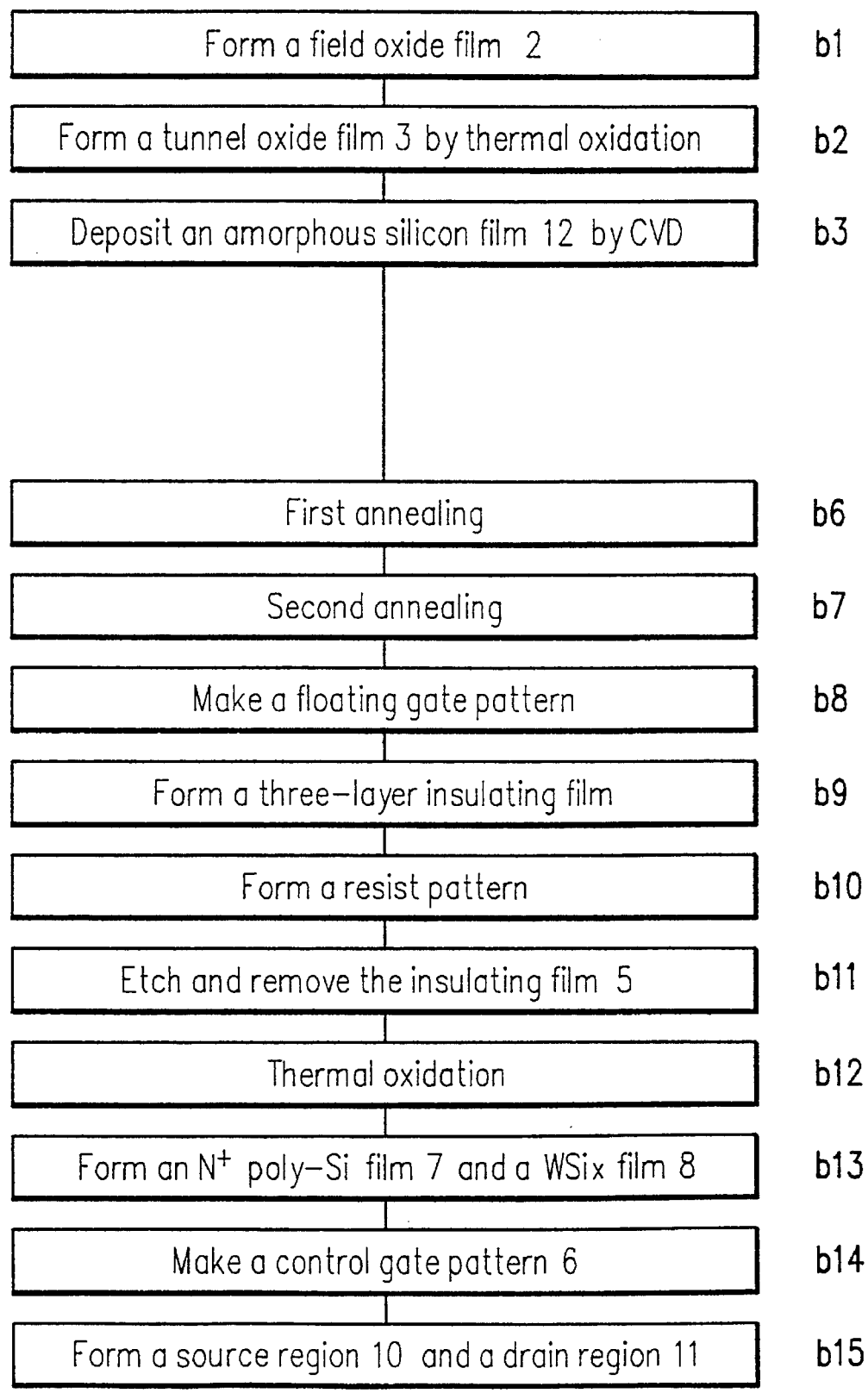
FIG. 15 is a process chart showing production steps of the memory cell in this example.

Hereinafter, referring to FIG. 15, a production method for the memory cell in this example will be described. FIG. 15 is a process chart illustrating the production steps of the memory cell of the flash memory in this example. As cross sections and the like of the memory cell for illustrating the production steps, FIGS. 4A to 13B for the first example can be referred as desired.

Steps b1–b3 shown in FIG. 15 are substantially the same as steps a1–a3 in the first example. In this example, the thickness t1 of the amorphous silicon film 12 was set to be 12.5 nm.

To the amorphous silicon film 12, the arsenic ion implantation, or the impurity diffusion such as thermal diffusion using PSG or BSG or the like was not performed at all. That is, steps a4–a6 shown in FIGS. 6A and 6B are omitted.

After the amorphous silicon film 12 is deposited, the first and second annealing steps are performed to the amorphous silicon film 12 (steps b6 and b7), whereby the amorphous silicon film 12 is crystallized so as to obtain the poly-Si film 14. Steps b9–b15 performed after the pattern of the floating gate 4 is formed (step b8) are the same as steps a10–a16 described in the first example.

After the above steps, the thickness t14 of the final floating gate 4 of the memory cell in this example was about 10 nm. It was confirmed that, since the thickness t14 of the floating gate 4 was made as thin as about 10 nm, the depth d1 of the recess 17 of the field oxide film 2 formed due to the etching of the insulating film between the control gate 6 and the floating gate 4 becomes 13 nm or less. Therefore, the overlap margin between the floating gate 4 and the field oxide film 2 of 180 nm is sufficient. That is, the overlap margin was greatly reduced as compared with the first example. The height difference between the memory cell array portion and the peripheral portion caused by the floating gate 4 was confirmed to be 30 nm.

As described above, according to the memory cell of this example, the same effects as those by the memory cell in the first example were also attained, and moreover, the degree of overlap margin between the floating gate 4 and the field oxide film 2 could be further reduced. In addition, the height difference at the boundary between the memory cell array portion and the peripheral circuit portion could be further reduced.

Since the floating gate 4 was highly resistive, the program speed was significantly increased as described above, and hence the power consumption was improved.

EXAMPLE 3

A nonvolatile memory cell in still another example according to the invention will be described.

Figure 16A:
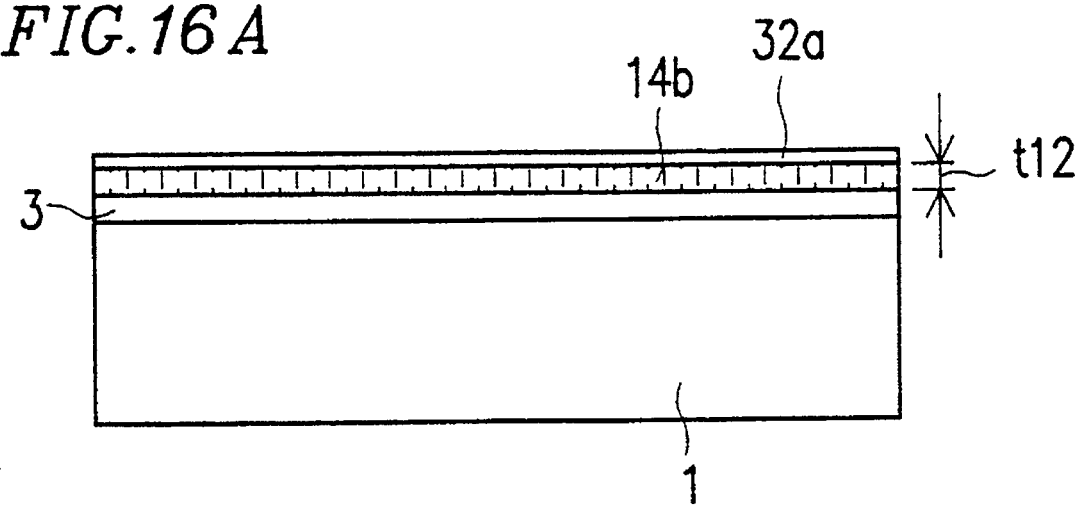
FIGS. 16A, 16B, and 16C are cross-sectional views for illustrating part of production process of the memory cell in this example.
Figure 16B:
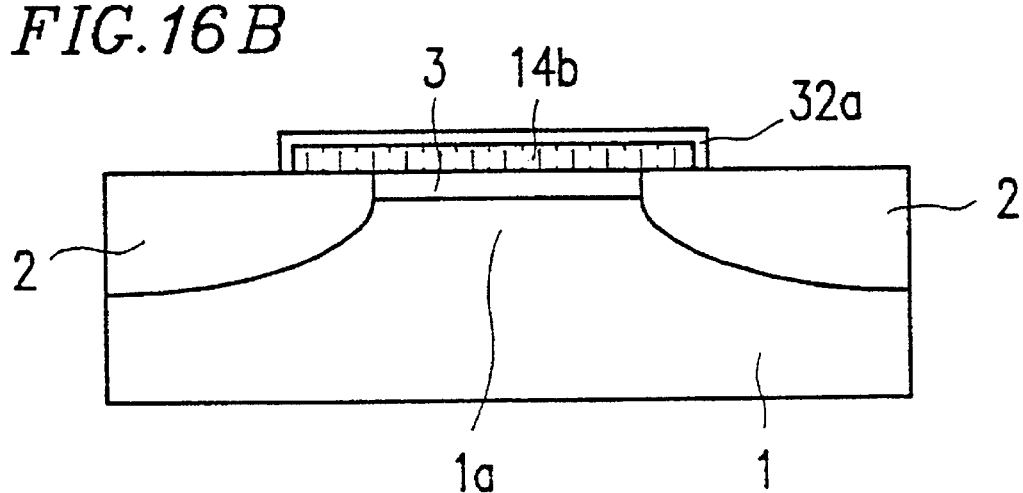
Figure 16C:
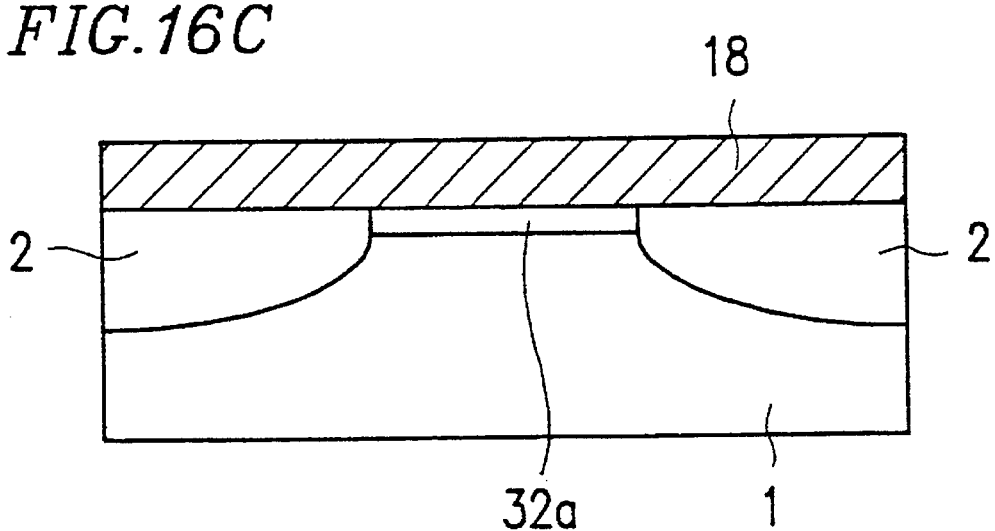
Figure 17A:
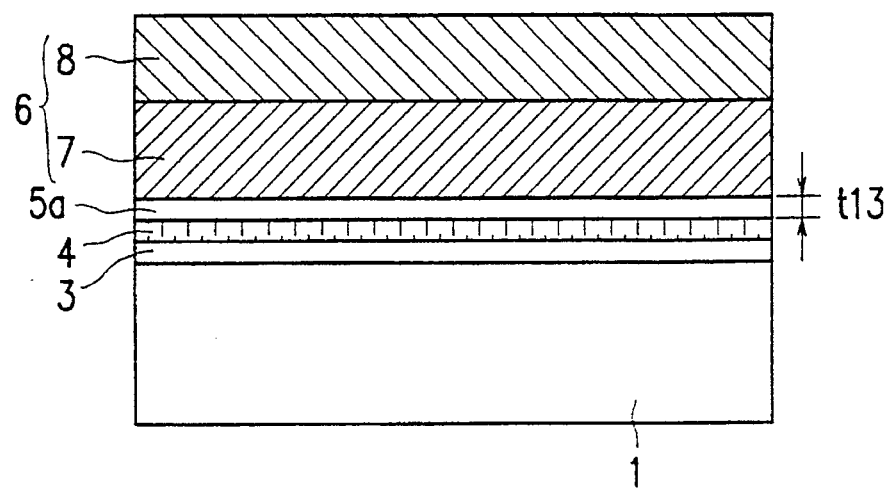
FIGS. 17A, 17B, and 17C are cross-sectional views for illustrating part of production process of the memory cell in this example.
Figure 17B:
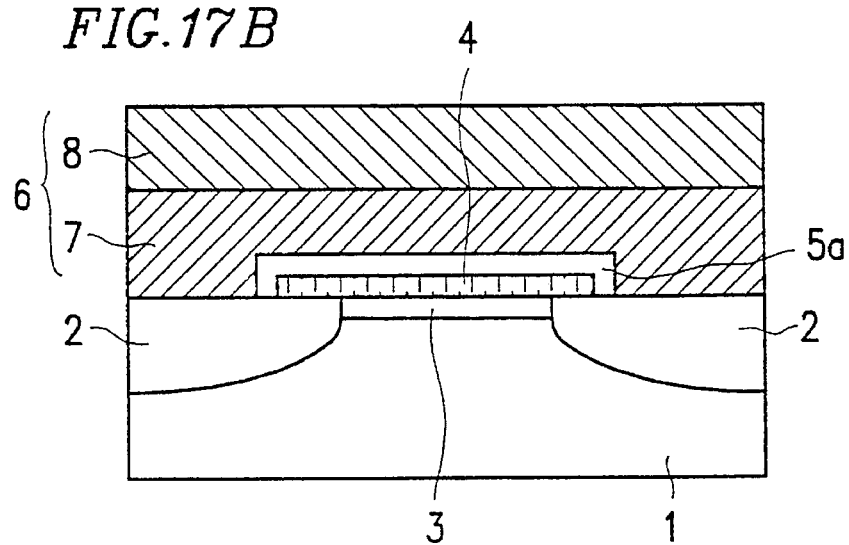
Figure 17C:
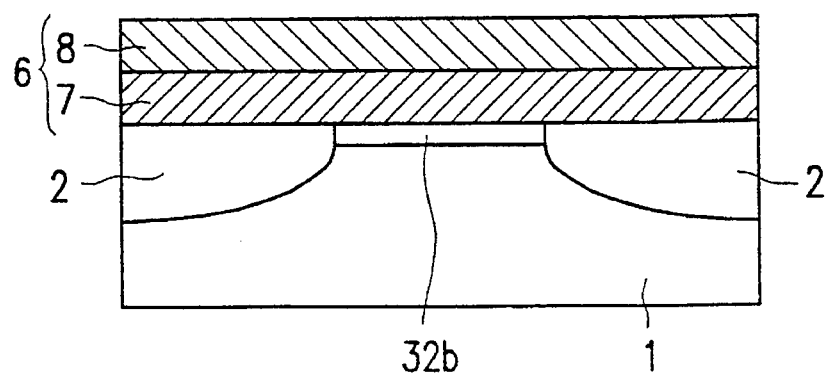

FIGS. 16A to 17C are cross-sectional views illustrating part of the production process of the memory cell in this example. As to other process steps of the production process in this example, FIGS. 4A to 13B in the first example are referred to. FIG. 18 is a process chart illustrating the process steps in this example. FIGS. 16A and 17A are cross-sectional views corresponding to the cross section taken along the line X2—X2 in FIG. 1. FIGS. 16B and 17B are cross-sectional views corresponding to the cross section taken along the line X3—X3 in FIG. 1. FIGS. 16C and 17C are cross-sectional views of a peripheral circuit portion of a memory cell MC.

The construction of the flash memory cell obtained in accordance with the production method of this example is the same as that of the memory cell MC in the first example. The memory cell in this example is mainly different from the memory cell in the first example in that the insulating film (the second insulating film) between the floating gate 4 and the control gate 6 in this example is made of a single-layer oxide film, rather than the ONO insulating film.

Hereinafter, the production method in this example is described with reference to FIGS. 16A to 18. Steps c1–c6 in FIG. 18 are substantially the same as steps a1–a6 in the first example. In this example, the thickness t12 of the amorphous silicon film 12 was set to be 22 nm. After arsenic ions are implanted in step c5, the oxide film 13 (FIGS. 6A and 6B) is etched in step c6. In steps c7 and c8, the amorphous silicon film 12 (FIGS. 6A and 6B) is annealed, so as to form a poly-Si film.

Next, the poly-Si film formed on the entire face of the substrate 1 is patterned so as to form a poly-Si film 14b (step c9). Thereafter, as is shown in FIGS. 16A, 16B, and 16C, an oxide film 32a is grown to have a thickness of 13 nm at 900° by dry oxidation using hydrochloric acid ($HCl/O_2$) (step c10). The oxide film 32a is formed on the surface of the poly-Si film 14b, and in the active region 1a of the peripheral circuit portion. Thereafter, as is shown in FIG. 16C, the peripheral circuit portion is covered with a resist pattern 18 (step c11), the oxide film 32a grown on the poly-Si film 14b is selectively etched and removed with HF solution (step c12). After the resist pattern 18 is removed (step c13), a cleaning is performed. Then, an oxide film is grown to have a thickness of 7 nm using the same conditions as those used in step c10 (step c14). As is shown in FIGS. 17A, 17B, and 17C, an oxide film 5a and an oxide film 32b are formed on the poly-Si film 14b and the active region 1a of the peripheral circuit portion, respectively. The oxide film 32b is the oxide film 32a but the thickness thereof is increased due to the oxidation step. By measuring the capacitances of the oxide films 5a and 32b, the thickness t13 of the oxide film 5a and the thickness t14 of the oxide film 32b were estimated to be 10 nm and 18 nm, respectively. These values do not always match the values measured by physical means such as TEM (transmission electron microscope) or the like. After the insulating film between the floating gate 4 and the control gate 6 and the gate insulating film of the transistor in the peripheral circuit portion are formed in this way, an $N^+$ poly-Si film 7 and a $WSi_x$ film 8 are deposited (step c15). The process step in step c16 after the formation of the control gate 6 and the process step c17 are the same as step a16 in the first example.

In the memory cell of this example, it was confirmed by the measurement by the inventors of this invention that the thickness t14 of the floating gate 6 was made as thin as 10 nm. As in the second example, it was confirmed that the depth d1 of the recess 17 in the field oxide film 2 occurring in the etching of the insulating film 5a was suppressed to be 13 nm or less. As a result, the overlap margin between the floating gate 4 and the field oxide film 2 can be set to be 163 nm. As in the second example, the overlap margin can be greatly decreased as compared with the prior art method. The height difference at the boundary between the memory cell array portion and the peripheral circuit portion due to the floating gate 4 was confirmed to be 13 nm which was negligible.

When the oxide film 5a is formed by thermally oxidizing a usual relatively thick poly-Si film, the breakdown voltage of the oxide film 5a is generally reduced due to the occurrence of so-called asperities and the like. Accordingly, it has been difficult to reduce the thickness of the oxide film 5a. However, the poly-Si film 14b in this invention is formed to be ultra-thin, so that the degree of asperities of the surface is significantly lowered. On the surface of such a thin poly-Si film, there is almost no unevenness which may cause any electric field concentration. The thickness of the oxide film 5a grown on the surface may vary due to the crystal orientation of respective crystal grains. However, the degree of fluctuation can be negligible as compared with the thickness variation in the prior art. As described above, the insulating film 5a in this example has a high thickness uniformity and a good breakdown voltage.

The insulating film 5a between the control gate 6 and the floating gate 4 is formed using an oxide film having a thickness t13 of 10 nm. Thus, the capacitance between the control gate 6 and the floating gate 4 is 1.9 times as large as that in the second example. As a result, the coupling constant which represents the ratio of capacitance between the control gate 6 and the floating gate 4 to the total capacitance of the floating gate 4 is increased from about 0.5 to 0.6 or more.

Accordingly, it is possible to lower the voltage applied to the control gate 6. In addition, the retention characteristic of the thermal oxide film 5a is almost equal to that of the ONO insulating film in the first and second examples, and hence the thermal oxide film 5a has no problems. The retention characteristic is the charge holding characteristic. If the retention characteristic is poor, a charge may move out of the floating gate 4.

In this example, the effects in the first example can be attained, and additional improved effects which are inherent to this example can also be attained.

EXAMPLE 4

Another production method of a nonvolatile memory cell according to the invention will be described. FIG. 19 is a process chart illustrating the production method of this example. In the description of the production process in this example, FIGS. 4A to 13B are appropriately referred to. This example is similar to the first example, so that like components are indicated by like reference numerals.

Steps d1–d3 in FIG. 19 are substantially the same as steps a1–a3 in the first example. In this example, in steps d1–d3, the thickness t12 of the amorphous silicon film 12 was set to be 19 nm. In this example, the arsenic ion implantation, or the impurity diffusion such as thermal diffusion using PSG or BSG or the like in the first example was not performed at all. In this example, the insulating film 5b between the floating gate 4 and the control gate 6 was formed by thermal oxidation.

In steps d6 and d7, the amorphous silicon film 12 is annealed to form a poly-Si film 14. After the pattern of floating gate 4 is formed in step d8, the memory cell MC is formed through the same process steps as steps c10–c17 in FIG. 18 of the third example.

First, in step d9, an oxide film is grown to have a thickness of 10 nm at 900° by dry oxidation using hydrochloric acid (HCl/O$_2$). Thereafter, in steps d10–d12, the oxide film in the cell array portion is etched using the HF solution, and then in step d13, an oxide film is grown to have a thickness of 10 nm using the same conditions as those used in step d9. The thickness t14 of the floating gate 4 at this time is about 10 nm. The process step in d17 after the formation of the control gate 6 is the same as that in step a16 in the first example.

In this example, the floating gate 4 undergoes no doping steps, so that the floating gate 4 is fully depleted and acts as a dielectric film. If the floating gate 4 is fully regarded as a dielectric film, the equivalent oxide thickness of the floating gate 4 is about 3.3 nm. The equivalent oxide thickness of the insulating film 5a between the floating gate 4 and the control gate 6 is about 14 nm, which is sufficiently thin as compared with the thickness of the ONO insulating film conventionally used.

It was confirmed by the inventors of this invention that the thickness t14 of the floating gate 4 was made as thin as 10 nm. The depth d1 of the recess 17 occurring in the field oxide film 2 during the etching of the insulating film 5a becomes 13 nm or less. Therefore, the overlap margin between the floating gate 4 and the field oxide film 2 becomes 163 nm, which is largely reduced as compared with that in the first example. The height difference at the boundary between the cell array portion and the peripheral circuit portion due to the floating gate 4 was confirmed to be 13 nm, which was negligible.

For example, it is assumed that the lower limit of thickness of the ONO insulating film 5 in the first example is 15 nm in equivalent oxide thickness, and the lower limit of thickness of the tunnel oxide film 3 on the floating gate 4 is 8 nm. Accordingly, in order to effectively use the invention, it is necessary to suppress the equivalent increase in thickness of the overlying oxide film due to the floating gate 4 to be 7 nm or less. Under the worst conditions in which the floating gate 4 functions as a dielectric film, the equivalent oxide thickness of 7 nm corresponds to the thickness of 21 nm of the floating gate 4. In this example, it was confirmed by the inventors of this invention that the final thickness of the floating gate 4 was 10 nm, which falls within this constraint. In this way, a nonvolatile memory can be produced according to this example.

In this example, the effects in the first example can be attained, and additional effects which are inherent to this example and improved as compared with the above-described examples can also be attained.

EXAMPLE 5

Another nonvolatile memory cell according to the invention will be described. The construction of the memory cell in this example is basically the same as that of the memory cell shown in FIGS. 1 to 3. This example is characterized in the production method thereof.

Figure 22A:
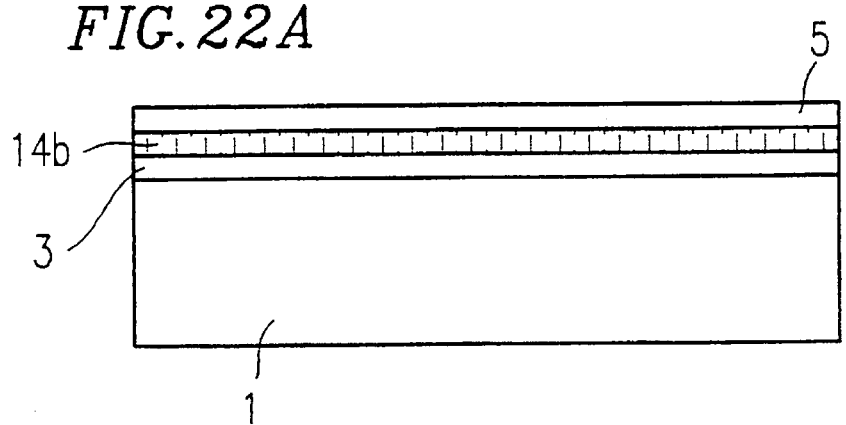
FIGS. 22A, 22B, and 22C are cross-sectional views illustrating part of the production process in this example.
Figure 22B:
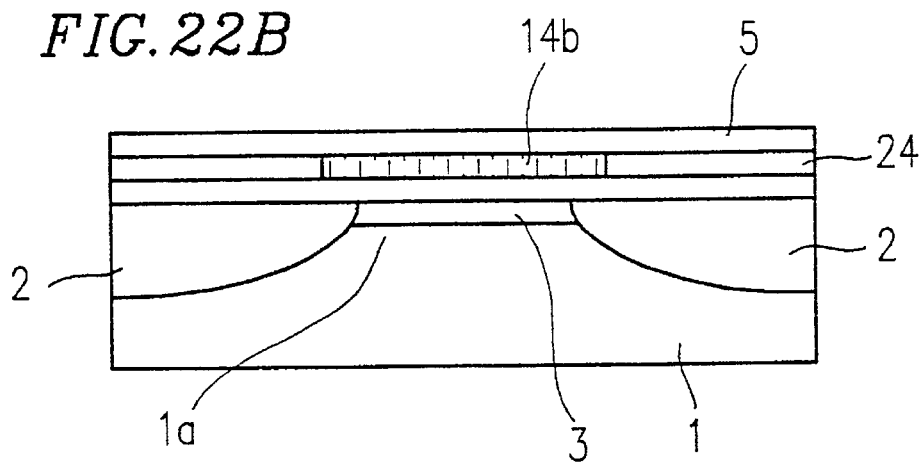
Figure 22C:
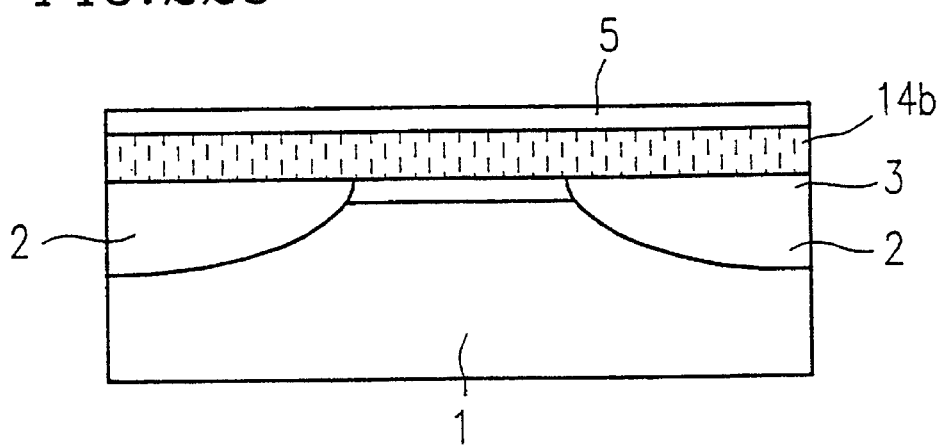
Figure 23A:
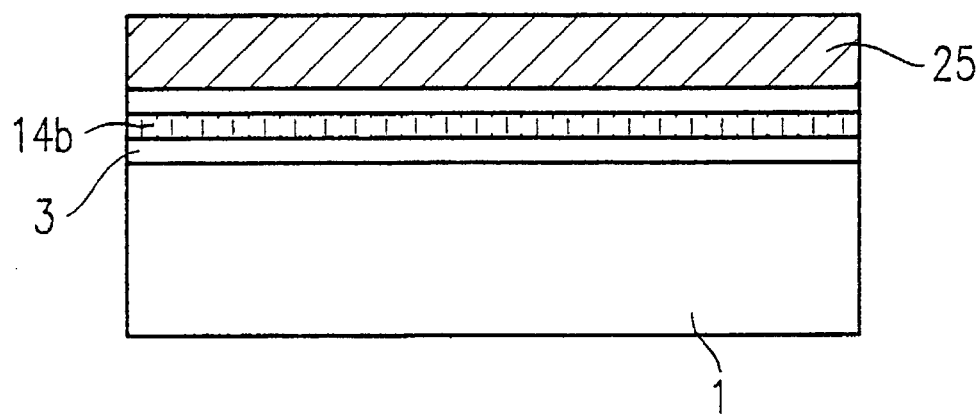
FIGS. 23A, 23B, and 23C are cross-sectional views illustrating part of the production process in this example.
Figure 23B:
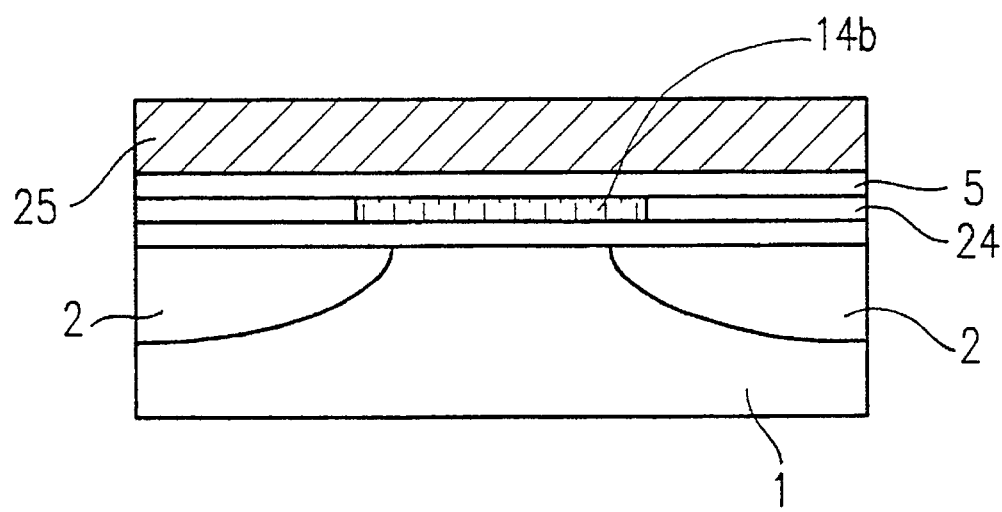
Figure 23C:
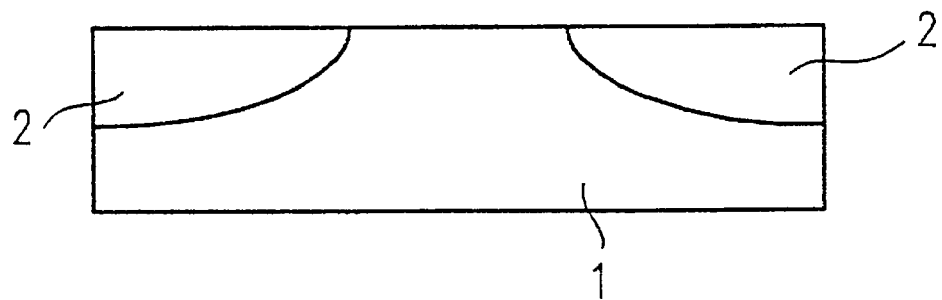
Figure 24:
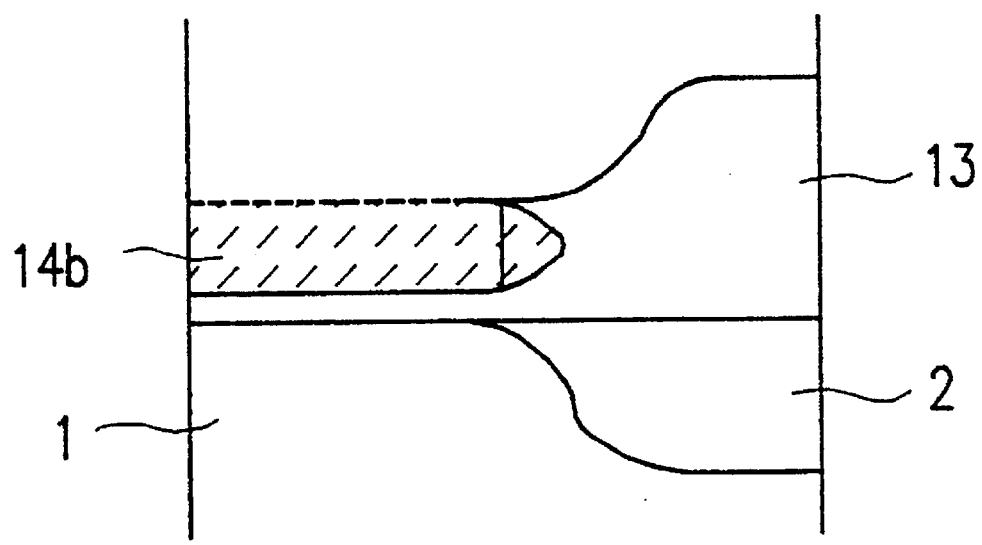
FIG. 24 is a cross-sectional view illustrating part of production process in this example.
Figure 25:
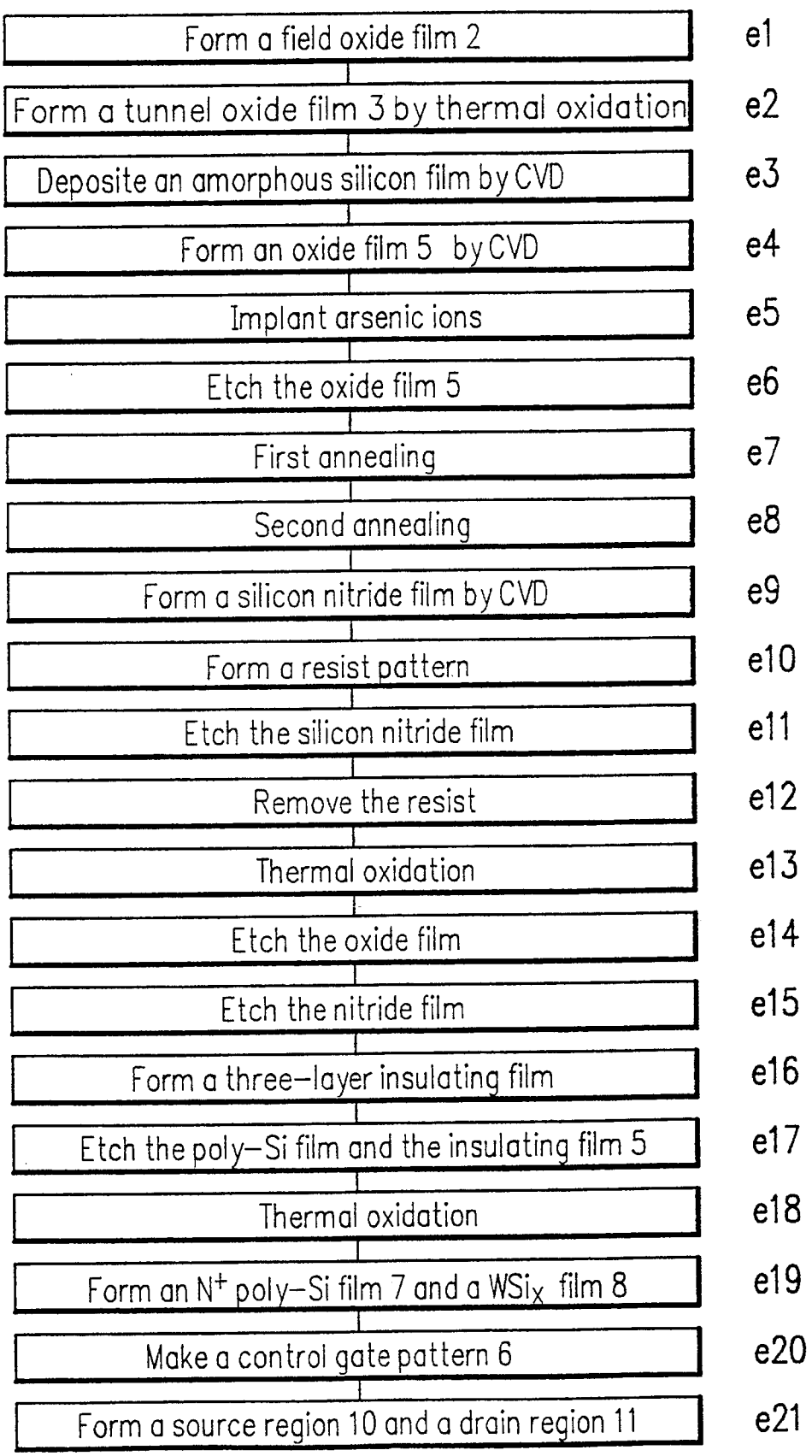
FIG. 25 is a process chart showing production steps of this example.

Referring to FIGS. 20A to 24, the production method of the memory cell in this example is described. FIGS. 20A to 24 are cross-sectional views for illustrating part of the production process of the memory cell of the flash memory in this example. As to other steps of the production process in this example, FIGS. 4A to 13B are appropriately referred to. FIG. 25 is a process chart of the production process in this example. FIGS. 20A, 21A, 22A, and 23A are cross-sectional views corresponding to a cross section taken along the line X2—X2 in FIG. 1. FIG. 20B, 21B, 22B, and 23B are cross-sectional views corresponding to a cross section taken along with line X3—X3 in FIG. 1. FIGS. 22C and 23C are cross-sectional views of the peripheral circuit portion of the memory cell MC. FIG. 24 is an enlarged cross-sectional view showing a portion in the vicinity of the memory cell MC. This example is similar to the first example, so that like components are indicated by like reference numerals.

Figure 20A:
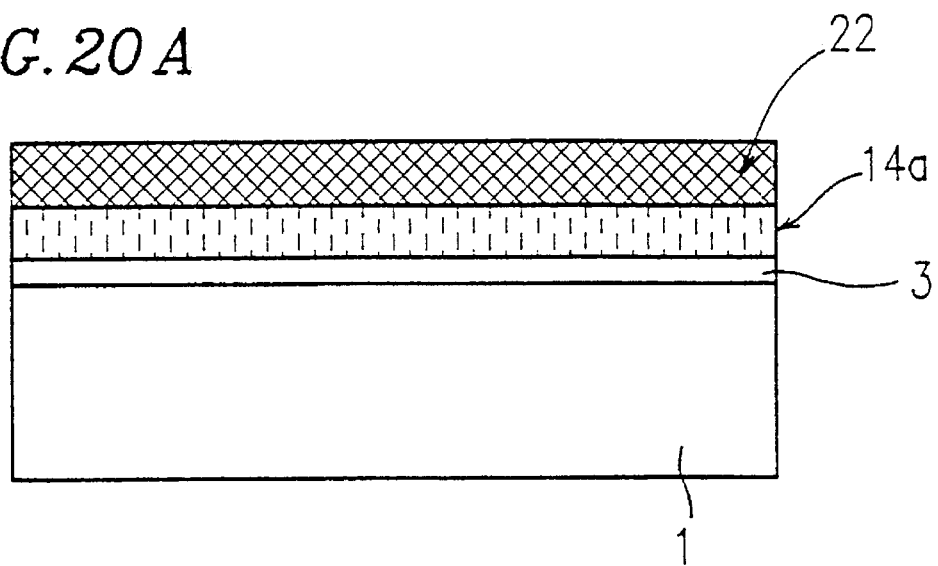
FIGS. 20A and 20B are cross-sectional views illustrating part of the production process in a fifth example of the invention.
Figure 20B:
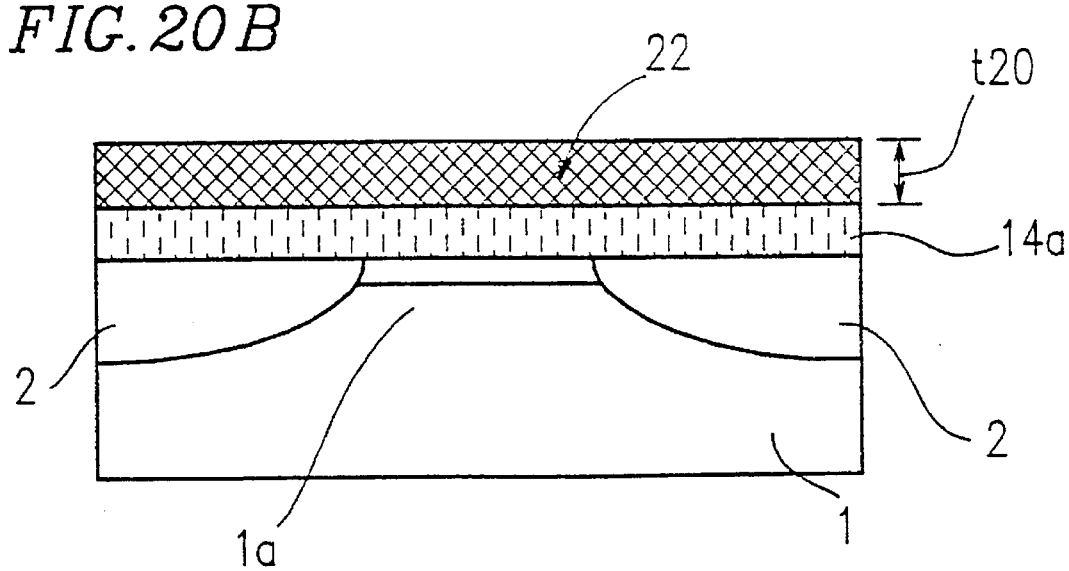

In steps e1–e8, substantially the same process steps as steps a1–a8 in the first example are performed. In this example, the thickness t12 of the amorphous silicon film 12 was set to be 32 nm. After the arsenic ion implantation, on the poly-Si film 14 formed by 2-step annealing, a silicon nitride film (hereinafter, referred to as a nitride film) 22 having a thickness t20 of 120 nm is formed by CVD as is shown in FIGS. 20A and 20B (step e9).

Next, a resist (not shown) having a pattern corresponding to the pattern of the poly-Si film 14b in the memory cell portion and having a pattern covering at least the active region 1a in the peripheral circuit portion was formed (step e10). Thereafter, the nitride film 22 was patterned using the resist as an etching mask, so as to obtain a silicon nitride film 23 shown in FIGS. 21A and 21B (step e11).

Figure 21A:
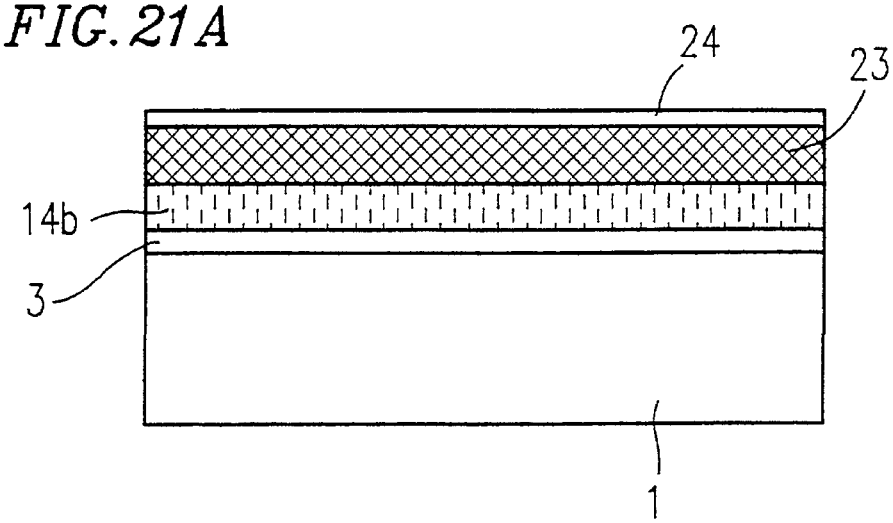
FIGS. 21A, 21B, and 21C are cross-sectional views illustrating part of the production process in this example.
Figure 21B:
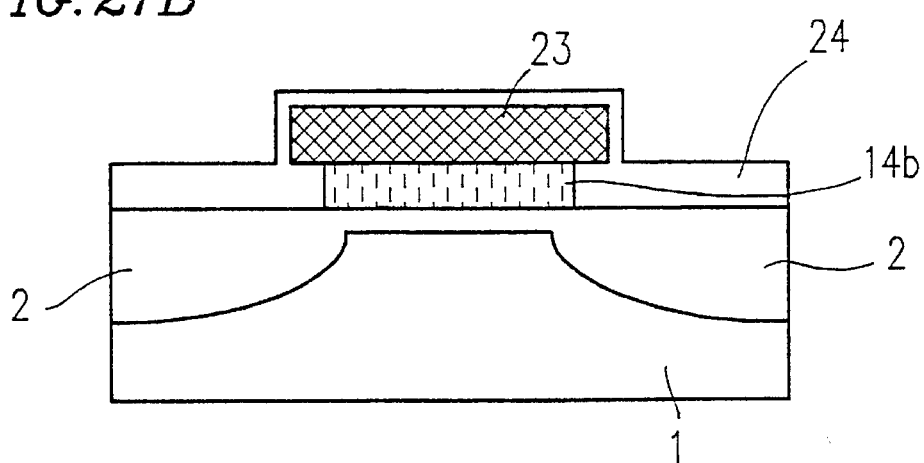
Figure 21C:
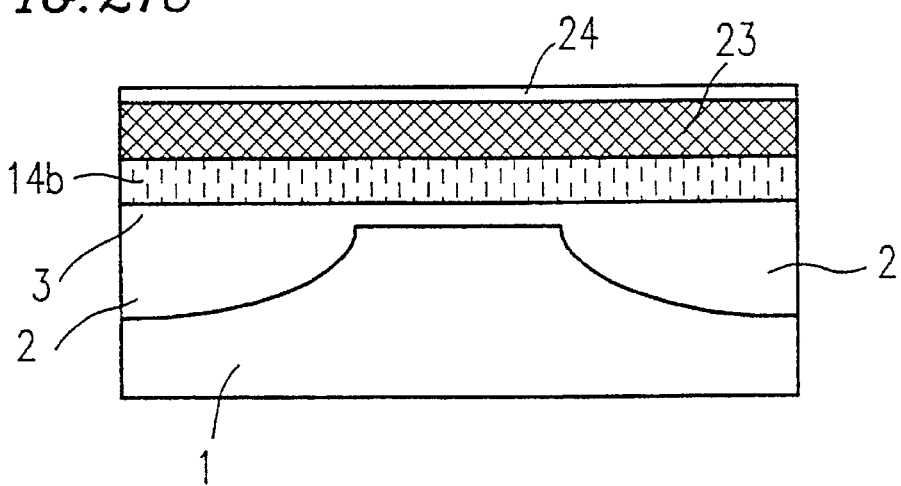

After removing the resist (step e12), a thermal oxidation is performed (step e13). As the result of the thermal oxidation, portions of the poly-Si film 14a which are not covered with the silicon nitride film 23 are selectively oxidized as shown in FIGS. 21A, 21B, and 21C, so as to form an oxide film 24. As the result of the selective oxidation, a poly-Si film 14b with both side faces covered with the oxide film 24 is formed. During the thermal oxidation step, the oxide film 24 is thinly grown on the surface of the silicon nitride film 23. The oxide film 24 grown on the nitride film 23 is etched with the HF solution (step e14), so as to expose the nitride film 23. Thereafter, the nitride film 23 is completely removed with a hot and concentrated phosphoric acid solution (step e15).

Next, as in the first example, as is shown in FIGS. 22A, 22B, and 22C, the ONO insulating film 5 is formed (step e16). Next, as is shown in FIGS. 23A, 23B, and 23C, after a resist pattern 25 having an opening at the peripheral circuit portion is formed, the ONO insulating film 5 in the peripheral circuit portion is etched and removed (step e18). In this example, during the etching of the ONO insulating film 5, a portion of the poly-Si film 14b existing in the active region 1a of the peripheral circuit portion is removed. The subsequent steps are the same as those in the first example.

As described above, according to this example, in order to obtain the poly-Si film 14b from the poly-Si film 14a, a portion of the poly-Si film 14a to be removed is not removed by etching, but the portion is oxidized by selective oxidation using the nitride film 23 as a mask. The oxidized portion is etched after the ONO insulating film 5 is etched. Therefore, the peripheral portion of the poly-Si film 14b is covered with the oxide film 24 during the etching of the ONO insulating film 5, so that the field oxide film 2 can be left unetched. Accordingly, the recess 17 cannot be caused in the field oxide film 2. Thus, when a memory cell is produced according to the method of this example, the overlap margin between the field oxide film 2 and the floating gate 4 can be set to be 150 nm. In this example, it was confirmed there was no height differences at the boundary between the cell array portion and the peripheral circuit portion.

It is preferred that the thickness t14 of the poly-Si film 14a is thin, for example, 40 nm or less. If the thickness t14 of the poly-Si film 14a is thick, a bird's beak goes into the interface between the nitride film 23 and the poly-Si film 14b during the selective oxidation of the poly-Si film 14a. As a result, the facing area of the floating gate 4 and the control gate 6 becomes small. This decreases the coupling constant, and hence the current retention characteristic in the floating gate 4 is deteriorated, In addition, there may occur a case where the poly-Si film 14 has a shape shown in FIG. 24 and the floating gate 4 remains unetched during the process for the control gate 6. For the above reasons, the poly-Si film 14 is preferred to be as thin as possible. It is appreciated that the poly-Si film 14 can be a non-doped film which is used in the second example.

According to the memory cell produced by the production method of this example, the effects in the previous examples can be attained, and above-mentioned effects which are inherent to this example can also be attained.

EXAMPLE 6

Another nonvolatile memory cell according to the invention will be described. The construction of the memory cell in this example is basically the same as that of the memory cell shown in FIGS. 1 to 3. This example is characterized in the production method thereof.

Figure 26A:
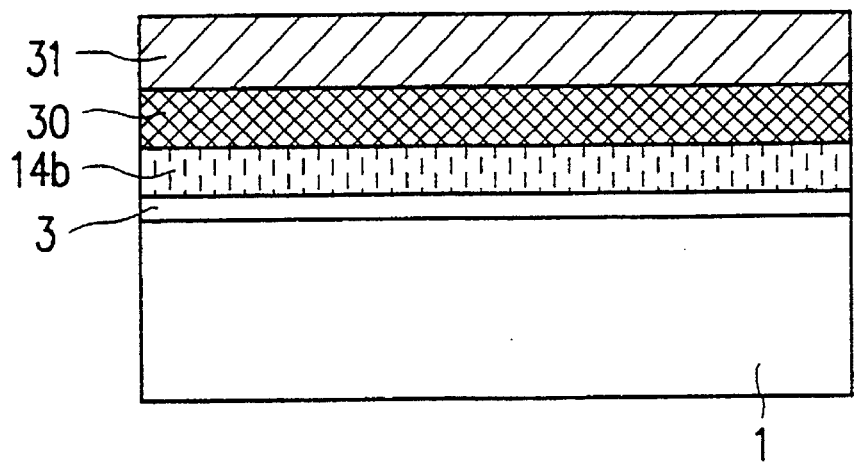
FIGS. 26A, 26B, and 26C are cross-sectional views illustrating part of the production process in a sixth example of the invention.
Figure 26B:
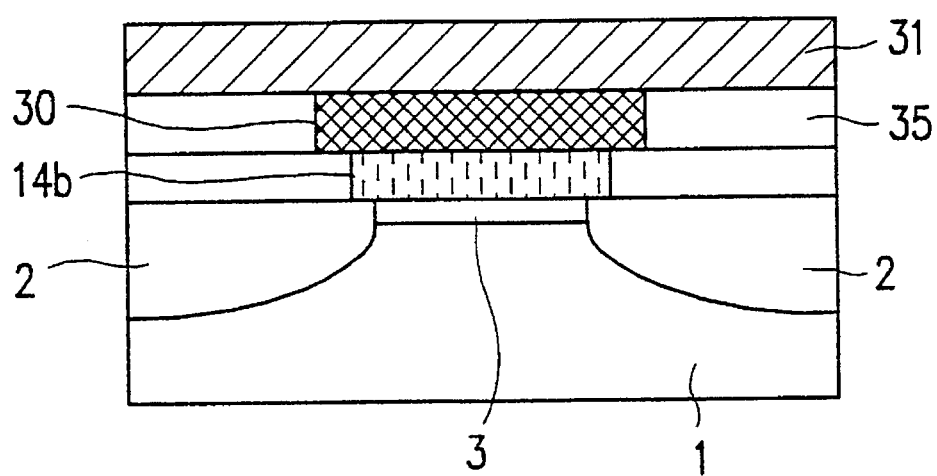
Figure 26C:
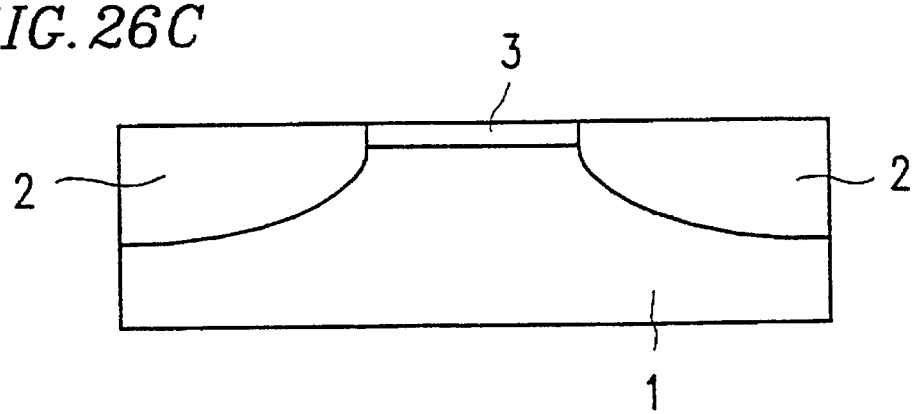
Figure 27A:
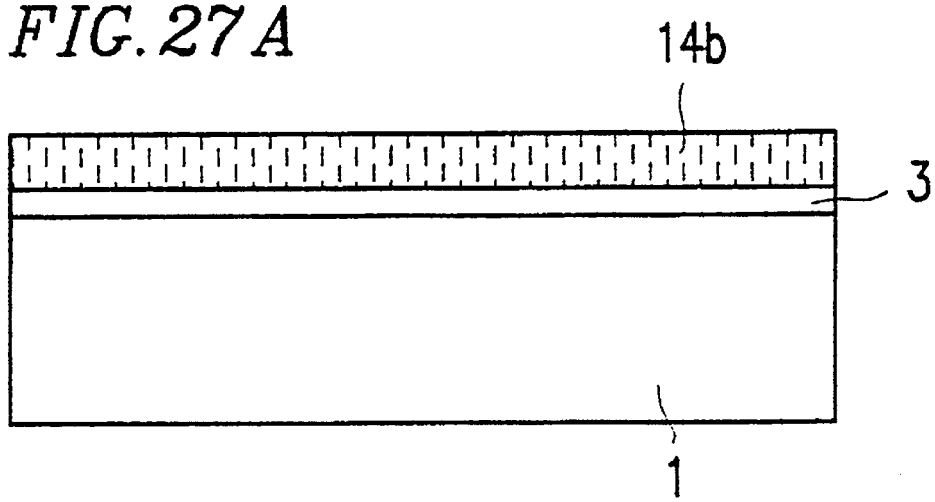
FIGS. 27A, 27B, and 27C are cross-sectional views illustrating part of the production process in this example.
Figure 27B:
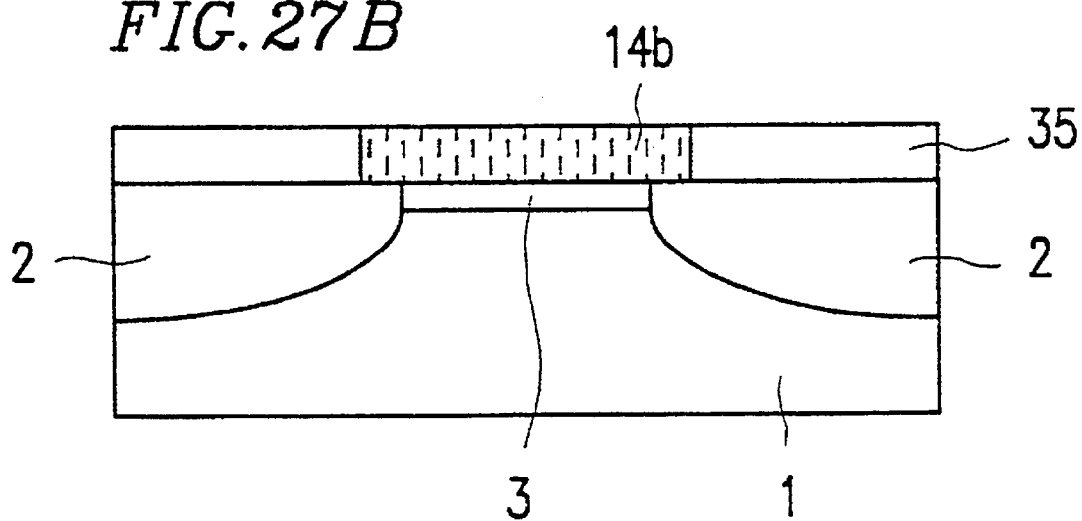
Figure 27C:
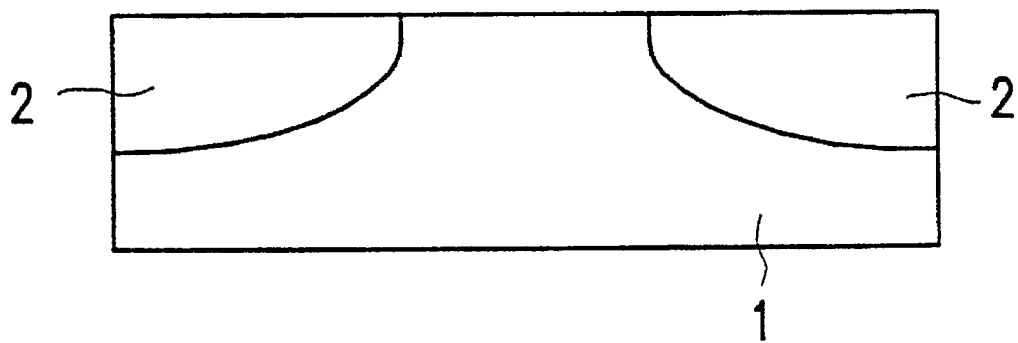
Figure 28A:
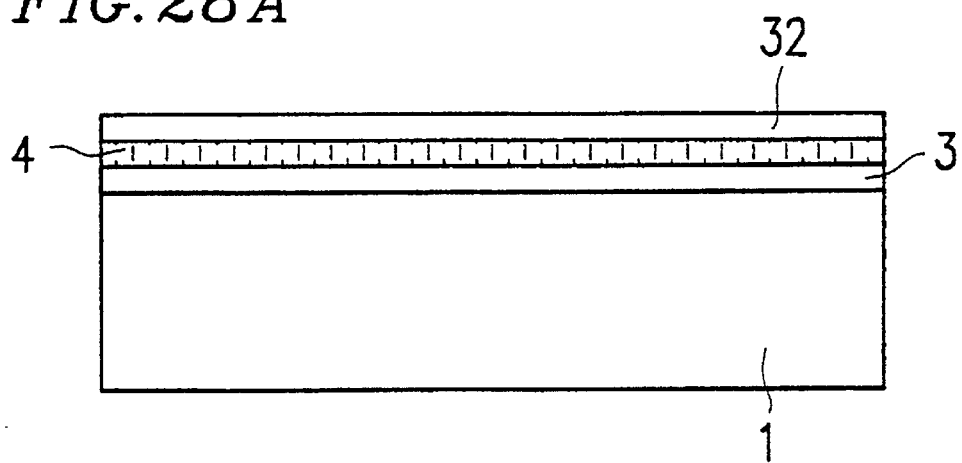
FIGS. 28A, 28B, and 28C are cross-sectional views illustrating part of the production process in this example.
Figure 28B:
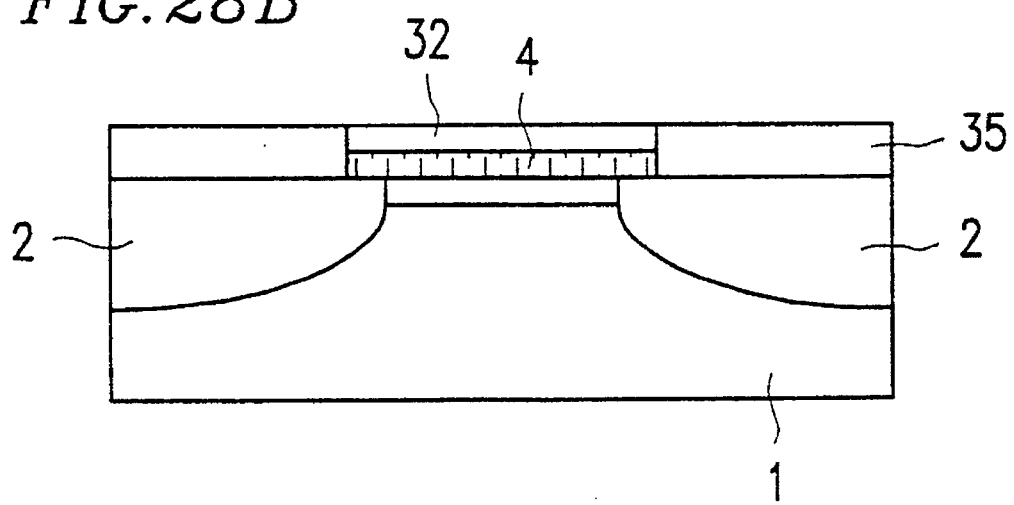
Figure 28C:
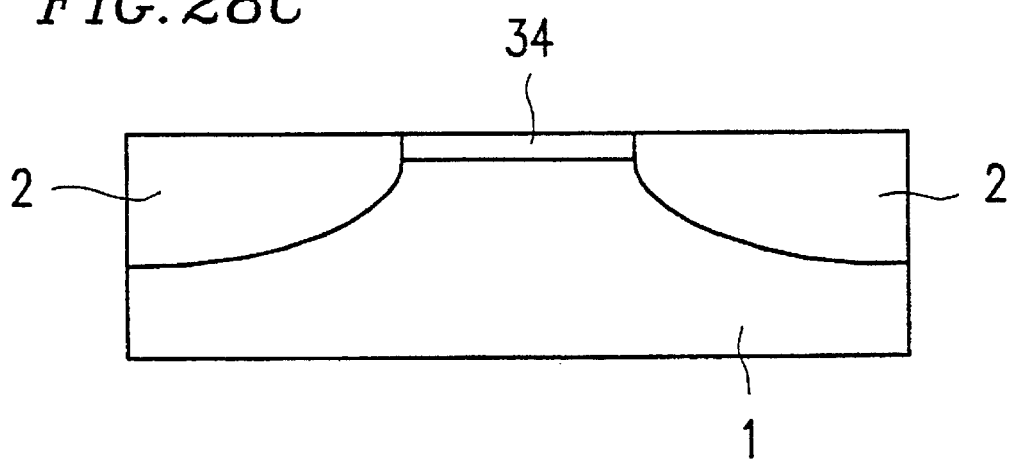
Figure 29:
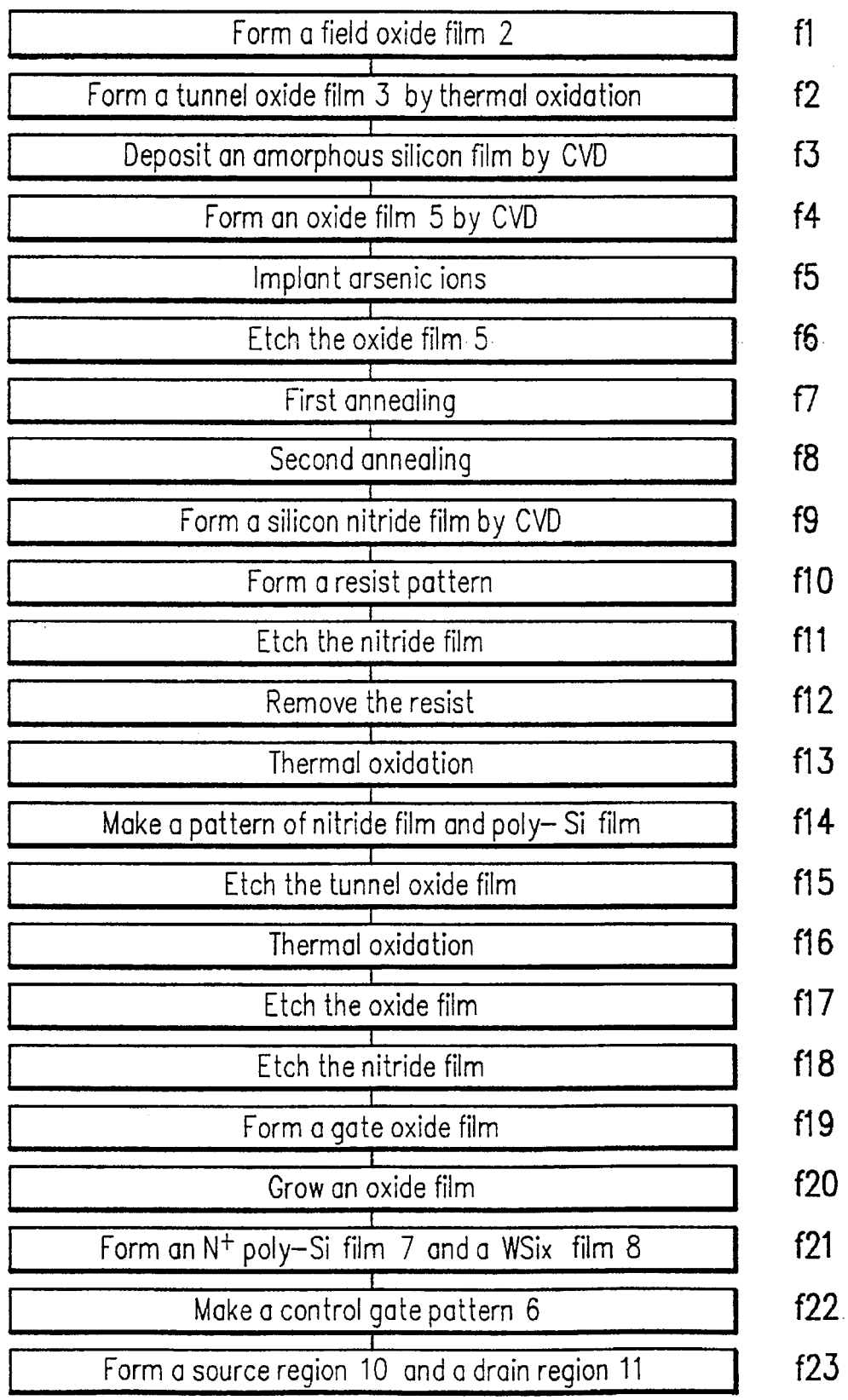
FIG. 29 is a process chart showing production steps of this example.
Figure 30:
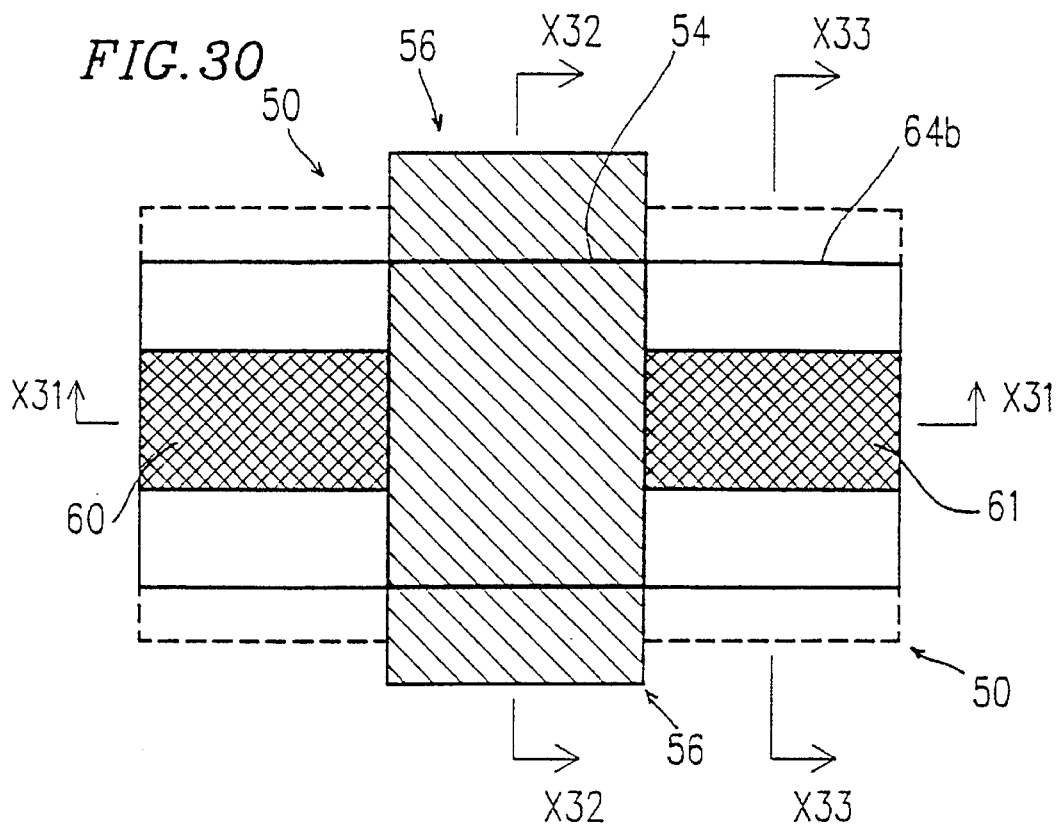
FIG. 30 is a plan view showing a conventional memory cell.
Figure 31:
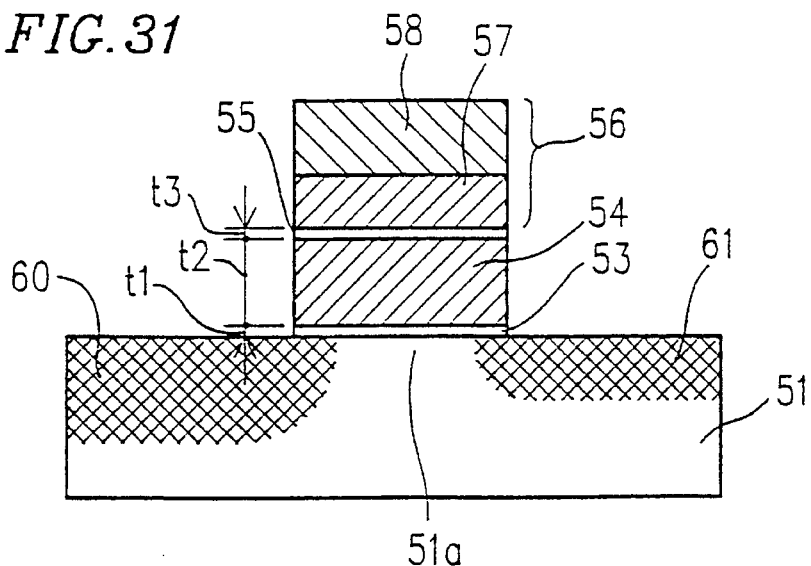
FIG. 31 is a cross-sectional view taken along the line X31—X31 in FIG. 30.
Figure 32:
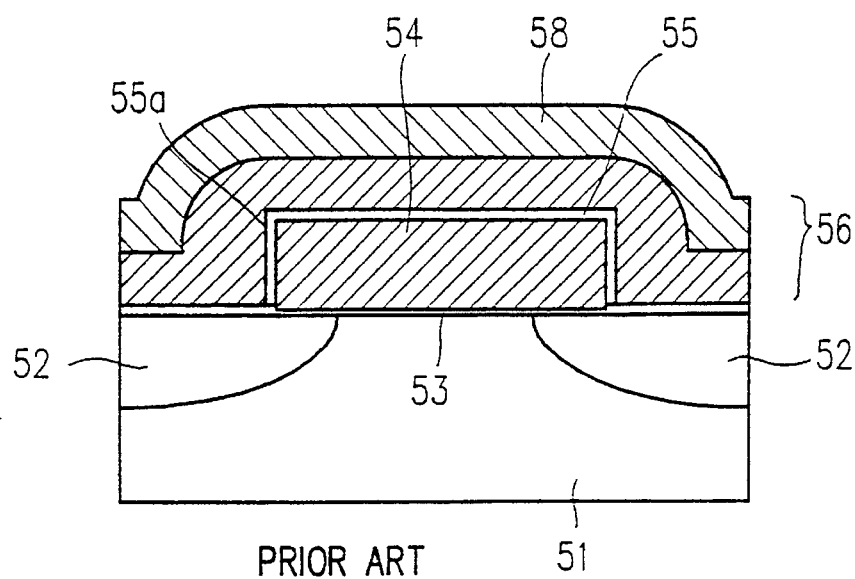
FIG. 32 is a cross-sectional view taken along the line X32—X32 in FIG. 30.
Figure 33:
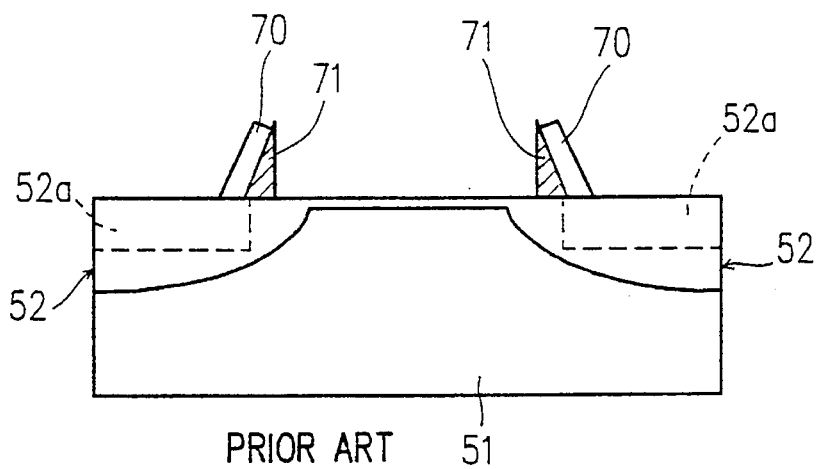
FIG. 33 is a cross-sectional view taken along the line X33—X33 in FIG. 30.
Figure 34:
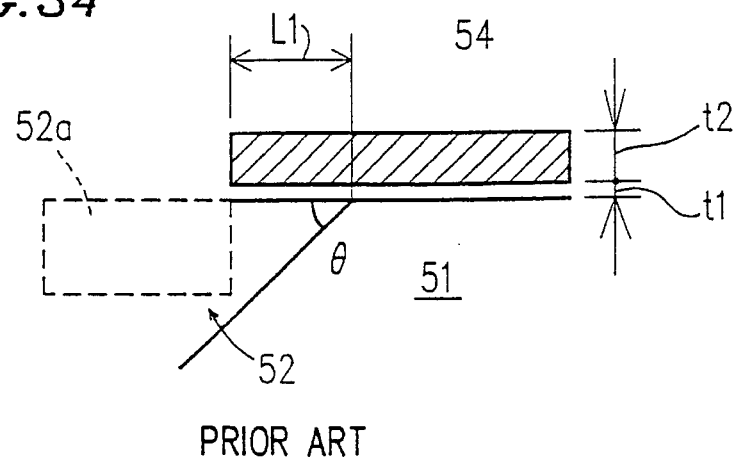
FIG. 34 is a cross-sectional view for illustrating problems of the conventional memory cell.

FIGS. 26A to 28C are cross-sectional views for illustrating part of the production process of the memory cell in this example. As to other steps of the production process in this example, refer to FIGS. 4A to 13B. FIG. 29 is a process chart of the production process in this example. FIGS. 26A, 27A, and 28A are cross-sectional views corresponding to a cross section taken along the line X2—X2 in FIG. 1. FIGS. 26B, 27B, and 28B are cross-sectional views corresponding to a cross section taken along with line X3—X3 in FIG. 1. FIGS. 26C and 28C are cross-sectional views of the peripheral circuit portion of the memory cell MC. This example is similar to the first example, so that like components are indicated by like reference numerals.

In steps f1–f8 in this example, as in the third example, the thickness t12 of the amorphous silicon film 12 was set to be 22 nm. After the arsenic ion implantation, on the poly-Si film 14 formed by the first and second annealing steps, a silicon nitride film having a thickness t20 of 20 nm is formed by CVD (step f9). Next, a resist having a pattern corresponding to the pattern of the poly-Si film 14b in the memory cell portion and having a pattern covering at least the active region 1a in the peripheral circuit portion was formed (step f10). Thereafter, portions of the silicon nitride film which are not covered with the resist are selectively etched (step f11). After removing the resist (step f12), a thermal oxidation is performed (step f13). Portions of the poly-Si film 14b which are not covered with the silicon nitride film are selectively and thermally oxidized, so as to form an oxide film 35. The foregoing steps are substantially the same as those in the fifth example.

Next, as is shown in FIGS. 26A, 26B, and 26C, after a resist pattern 31 having an opening at the peripheral circuit portion is formed (step f14), portions of the nitride film 30 and the poly-Si film 14b which are not covered with the resist pattern 31 are etched. Thus, as is shown in FIG. 26C, the tunnel oxide film 3 is exposed in the peripheral circuit portion. Next, as is shown in FIGS. 27A, 27B, and 27C, after the resist pattern 31 is removed (step f15), the remaining tunnel oxide film 3 in the active region 1a of the peripheral circuit portion is etched and removed by the HF solution. Thereafter, the portion where the tunnel oxide film 3 existed is thermally oxidized (step f16). At this time, the oxide film 24 is thinly grown on the surface of the nitride film 30 left in the cell array portion. The thin oxide film grown on the nitride film 30 is etched by the HF solution (step f17), and then the nitride film 30 is removed with a hot and concentrated phosphoric acid solution (step f18).

After cleaning, as is shown in FIGS. 28A, 28B, and 28C, the oxidation is performed again, so as to form a gate oxide film 34 in the active region 1a of the peripheral circuit portion (step f19), and to grow an oxide film 32 having a thickness of 10 nm on the floating gate 4 (step f20).

The subsequent steps f21, f22, and f23 after the step of depositing the WSi$_x$ film 8 / poly-Si film 7 for the control gate 6 are the same as steps a14–a16 in the first example.

As described above, according to this example, in order to obtain the poly-Si film 14b from the poly-Si film 14a, a portion of the poly-Si film 14a to be removed is not removed by etching, but the portion is oxidized by selective oxidation using the nitride film 30 as a mask. The oxidized portion is etched after the ONO insulating film 5 is etched. Therefore, the peripheral portion of the poly-Si film 14b is covered with the oxide film during the etching of the ONO insulating film 5, so that the field oxide film 2 can be left unetched. Accordingly, the recess 17 cannot be caused in the field oxide film 2. Thus, when a memory cell is produced according to the method of this example, the overlap margin between the field oxide film 2 and the floating gate 4 can be set to be 150 nm. In this example, it was confirmed there was no height difference at the boundary between the cell array portion and the peripheral circuit portion. It is appreciated that the floating gate 4 may be a non-doped film as in the fourth example.

According to this example, the effects in the previous examples can be attained, and above-mentioned effects which are inherent to this example can also be attained.

As described above, according to the invention, due to the ultra-thin floating gate, it is possible to suppress the formation of the recess in an element isolating film during the patterning of the ONO insulating film, so that memory cells can be highly integrated. In addition, the height difference caused by the floating gate is reduced, so that the focus margin in the exposure is increased. This allows the production to be facilitated.

Because a floating gate with almost no unevenness is used, a second insulating film with high quality can be formed by thermally oxidizing the floating gate. Accordingly, the second insulating film can be made a lot thinner as compared to the conventional thin ONO insulating film.

Because the floating gate is made of a ultrathin film, it is possible to use a floating gate using a non-doped poly-Si film. According to such a floating gate, it is possible to omit the step of impurity diffusion into the thin poly-Si film, and also the operation speed can be improved.

Moreover, since the floating gate is patterned by selectively oxidizing the poly-Si film, it is unnecessary to etch the ONO insulating film on the stepped portion of the floating gate. Accordingly, the overlap margin between the field oxide film and the floating gate can be ideally set to be zero.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of producing a nonvolatile memory cell comprising the steps of:

forming an active region and an element isolating region on a semiconductor substrate;

forming a first insulating film on the semiconductor substrate;

forming a polycrystalline silicon film having a thickness of 55 nm or less on the first insulating film, the polycrystalline silicon film having a shape to cover at least the active region;

forming a second insulating film on the polycrystalline silicon film;

forming a conductive film on the second insulating film, etching the conductive film, the second insulating film and the polycrystalline silicon film sequentially, so as to form a control gate made of the conductive film and to form a floating gate made of the polycrystalline silicon film, wherein the step of forming the polycrystalline silicon film includes the steps of:

depositing an amorphous silicon film on the first insulating film; and crystallizing the amorphous silicon film by annealing to form the polycrystalline silicon film.

2. A method according to claim 1, wherein the step of forming the polycrystalline silicon film having the shape includes a step of depositing an oxidation resistant film on the polycrystalline silicon film, a step of patterning the oxidation resistant film, and a step of selectively oxidizing part of the polycrystalline silicon film laterally extending beyond the patterned oxidation resistant film using the patterned oxidation resistant film as a mask.

3. A method according to claim 1, wherein the annealing includes a first annealing step at a first temperature and a second annealing step at a second temperature, the second temperature being higher than the first temperature.

4. A method according to claim 1 wherein the step of depositing comprises depositing a non-doped amorphous silicon film and the floating gate formed from the polycrystalline silicon film is non-doped.

5. A method according to claim 1 including implanting in the amorphous silicon film a concentration of impurity ions such that the floating gate formed of polycrystalline silicon has an impurity concentration of $1\times10^{19}/cm^3$ or less.

6. A method of producing a nonvolatile memory cell comprising the steps of:

forming a first insulating film on a semiconductor substrate;

forming a floating gate having a thickness of 55 nm or less on the first insulating film;

forming a second insulating film on the floating gate; and forming a control gate on the second insulating film, wherein the step of forming the floating gate includes the steps of:

depositing an amorphous silicon film on the first insulating film; and crystallizing the amorphous silicon film by annealing to form a polycrystalline silicon,film;

depositing an oxidation resistant film on the polycrystalline silicon film;

patterning the oxidation resistant film into a shape, and selectively oxidizing part of the polycrystalline silicon film laterally extending beyond the patterned oxidation resistant film using the patterned oxidation resistant film as a mask, so as to form the floating gate from the polycrystalline silicon film.

7. A method according to claim 6, wherein the annealing includes a first annealing step at a first temperature and a second annealing step at a second temperature, the second temperature being higher than the first temperature.

8. A method according to claim 6 wherein the step of depositing an amorphous silicon film comprises depositing a non-doped amorphous silicon film and the floating gate formed from the polycrystalline silicon film is non-doped.

9. A method according to claim 6 including implanting in the amorphous silicon film a concentration of impurity ions such that the floating gate formed of polycrystalline silicon has an impurity concentration of $1\times10^{19}/cm^3$ or less.

* * * * *